(12) United States Patent
Kung

(10) Patent No.: US 11,877,435 B2
(45) Date of Patent: Jan. 16, 2024

(54) SEMICONDUCTOR STRUCTURE HAVING AIR GAP

(71) Applicant: NANYA TECHNOLOGY CORPORATION, New Taipei (TW)

(72) Inventor: Yao-Hsiung Kung, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 94 days.

(21) Appl. No.: 17/573,774

(22) Filed: Jan. 12, 2022

(65) Prior Publication Data

US 2023/0225106 A1    Jul. 13, 2023

(51) Int. Cl.
    H10B 12/00    (2023.01)
(52) U.S. Cl.
    CPC ........... *H10B 12/30* (2023.02); *H10B 12/482* (2023.02)
(58) Field of Classification Search
    CPC .... H10B 12/482; H10B 12/488; H10B 12/30; H10B 12/34; H10B 12/05; H10B 12/485; H01L 21/7682; H01L 21/76829; H01L 21/76852; H01L 29/4236; H01L 29/513; H01L 29/515; G11C 11/4085
    See application file for complete search history.

(56) References Cited

U.S. PATENT DOCUMENTS

| | | |
|---|---|---|
| 2016/0351501 A1 | 12/2016 | Chun |
| 2018/0012775 A1 | 1/2018 | Byun et al. |
| 2020/0118929 A1 | 4/2020 | Kim et al. |
| 2021/0098464 A1 | 4/2021 | Huang et al. |
| 2021/0375878 A1* | 12/2021 | Zhang ................. H10B 12/315 |

FOREIGN PATENT DOCUMENTS

| | | |
|---|---|---|
| CN | 110718550 A | 1/2020 |
| CN | 112447604 A | 3/2021 |
| CN | 113903736 A | 1/2022 |
| TW | 202021042 A | 6/2020 |
| TW | 202141759 A | 11/2021 |

OTHER PUBLICATIONS

Office Action and Search Report dated Nov. 23, 2022 related to Taiwanese Application No. 111112510.
Office Action and Search Report dated Mar. 7, 2023 related to Taiwanese Application No. 111112509.

* cited by examiner

*Primary Examiner* — Nicholas J Tobergte
*Assistant Examiner* — Kevin Quinto
(74) *Attorney, Agent, or Firm* — Xuan Zhang

(57) ABSTRACT

The present disclosure provides a semiconductor structure and a method of manufacturing the semiconductor structure. The semiconductor structure includes a first bit line on a substrate; a contact adjacent to the first bit line on the substrate, wherein a first distance between a top portion of the contact and the first bit line is less than a second distance between a lower portion of the contact and the first bit line; a dielectric layer, disposed conformally over the first bit line, the substrate, and the contact; and a first air gap, sealed by the dielectric layer and defined by the first bit line, the substrate and the contact.

14 Claims, 21 Drawing Sheets

SEMICONDUCTOR STRUCTURE HAVING AIR GAP

TECHNICAL FIELD

The present disclosure relates to a semiconductor structure, and a method of manufacturing the semiconductor structure. Particularly, the present disclosure relates to a semiconductor structure having an air gap, and a method of manufacturing the semiconductor structure.

DISCUSSION OF THE BACKGROUND

Due to a simplicity of structures of dynamic random-access memories (DRAM), compared to other types of memory such as static random-access memories (SRAM), a DRAM can provide more memory cells per chip area. The DRAM is composed of multiple DRAM cells. Each DRAM cell includes a capacitor for storing information and a transistor coupled to the capacitor to control when the capacitor is charged or discharged. During a read operation, a word line (WL) is asserted, thereby turning on the transistor. The turned-on transistor allows a sense amplifier to read a voltage across the capacitor through a bit line (BL). During a write operation, data to be written is provided to the BL when the WL is contacted.

In order to meet a demand for greater amounts of memory storage, sizes of DRAM memory cells continue to decrease; as such, a packaging density of the DRAMs has greatly increased. However, due to the size reduction of the DRAM memory cells, capacitive coupling, which leads to increases in parasitic capacitance, has become an increasingly important issue. As a result of the parasitic capacitance, a speed of the DRAM memory cell is undesirably reduced, and an overall device performance is negatively affected.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a semiconductor structure. The method includes forming a first bit line and a second bit line on a substrate, forming a patterned layer between the first bit line and the second bit line, wherein the patterned layer covers the substrate and surrounds a lower portion of the first bit line and a lower portion of the second bit line, forming a conformal layer on the patterned layer, forming a contact on the conformal layer and between the first bit line and the second bit line, wherein the contact is taller than the patterned layer as measured from the substrate, removing the patterned layer and the conformal layer; and forming an air gap between the contact and the first bit line, or between the contact and the second bit line, wherein the air gap is sealed by a dielectric layer.

In some embodiments, the method further includes forming a sacrificial layer over the first bit line, the second bit line and the substrate; and removing a portion of the sacrificial layer surrounding an upper portion of the first bit line and an upper portion of the second bit line, thereby forming the patterned layer.

In some embodiments, a height of the patterned layer is substantially greater than a height of a metal layer of the first bit line or a height of a metal layer of the second bit line, as measured from the substrate.

In some embodiments, the conformal layer covers a top of the patterned layer, an upper portion of the first bit line, and an upper portion of the second bit line.

In some embodiments, the method further includes removing a portion of the patterned layer and a portion of the conformal layer, thereby exposing the substrate, prior to the formation of the contact.

In some embodiments, the method further includes depositing a contact material layer over the conformal layer, the first bit line, and the second bit line; and removing a portion of the contact material layer thereby forming the contact, wherein a height of the contact is substantially greater than a height of the patterned layer.

In some embodiments, a first horizontal distance between a top portion of the contact and the first bit line is substantially less than a second horizontal distance between a lower portion of the contact and the first bit line.

In some embodiments, the first horizontal distance is defined by a thickness of the conformal layer.

In some embodiments, the second horizontal distance is defined by a thickness of the patterned layer and the thickness of the conformal layer.

In some embodiments, the formation of the air gap includes depositing the dielectric layer between the contact and the first bit line, or between the contact and the second bit line; and filling a space between the first bit line and a top portion of the contact, or a space between the second bit line and the top portion of the contact.

In some embodiments, a thickness of the dielectric layer is substantially equal to or greater than a half of the thickness of the conformal layer.

In some embodiments, a width of the air gap is substantially equal to the thickness of the patterned layer.

Another aspect of the present disclosure provides a method for manufacturing a semiconductor structure. The method includes forming a bit line on a substrate, forming a first dielectric layer over the substrate and surrounding a lower portion of the bit line, forming a second dielectric layer over the bit line and the first dielectric layer, forming a contact over the second dielectric layer, wherein a height of the contact above the substrate is greater than a height of the first dielectric layer above the substrate, removing the first dielectric layer and the second dielectric layer, and forming a third dielectric layer conformally over the bit line, the substrate and the contact, thereby forming an air gap between the contact and the bit line.

In some embodiments, the formation of the first dielectric layer includes forming a first conformal layer over the substrate and the bit line; forming a mask layer over the first conformal layer, removing a portion of the mask layer and a portion of the first conformal layer, thereby exposing an upper portion of the bit line, and removing a remaining portion of the mask layer.

In some embodiments, the height of the first dielectric layer is defined by the mask layer.

In some embodiments, the second dielectric layer is formed by a conformal deposition.

In some embodiments, a thickness of the first dielectric layer is between 1 and 5 nanometers.

In some embodiments, a thickness of the second dielectric layer is between 5 and 12 nanometers.

In some embodiments, the method further includes etching the first dielectric layer and the second dielectric layer, thereby forming a spacer structure surrounding the bit line, and exposing the substrate, prior to the forming the contact.

In some embodiments, the spacer is tapered toward a top of the bit line.

In some embodiments, at least one of the first dielectric layer, the second dielectric layer, and the third dielectric layer is formed by atomic layer deposition.

Another aspect of the present disclosure provides a semiconductor structure. The semiconductor structure includes a first bit line on a substrate, a contact adjacent to the first bit line on the substrate, wherein a first distance between a top portion of the contact and the first bit line is less than a second distance between a lower portion of the contact and the first bit line, a dielectric layer, disposed conformally over the first bit line, the substrate, and the contact, and a first air gap, sealed by the dielectric layer and defined by the first bit line, the substrate and the contact.

In some embodiments, the first bit line comprises a metal layer, and a vertical distance between a top of the contact and the substrate is greater than a vertical distance between a top of the metal layer and the substrate.

In some embodiments, the vertical distance between the top of the contact and the substrate is 5 to 45 nanometers greater than the vertical distance between the top of the metal layer and the substrate.

In some embodiments, the first bit line comprises the metal layer, and a vertical distance between a top of the first air gap and the substrate is greater than or equal to the vertical distance between the top of the metal layer and the substrate.

In some embodiments, a vertical distance between the top of the first air gap and the top of the metal layer is between 0 and 10 nanometers.

In some embodiments, a vertical distance between a top of the first bit line and the substrate is 90 to 130 nanometers greater than the vertical distance between the top of the contact and the substrate.

In some embodiments, the contact is tapered toward the substrate.

In some embodiments, the contact is configured in a T-shape.

In some embodiments, a thickness of the dielectric layer is between 3 and 6 nanometers.

In some embodiments, the dielectric layer fills a space between the top portion of the contact and the first bit line.

In some embodiments, a difference between the first distance and the second distance is substantially equal to a width of the first air gap.

In some embodiments, the semiconductor structure further includes a second bit line on the substrate, wherein the contact is disposed between the first bit line and the second bit line, and the dielectric layer is conformally formed over the second bit line; and a second air gap, sealed by the dielectric layer and defined by the second bit line, the substrate and the contact.

In some embodiments, a vertical distance between a top of the second air gap and the substrate is substantially greater than a vertical distance between a top of a metal layer of the second bit line and the substrate.

In some embodiments, a third distance between the top portion of the contact and the second bit line is substantially less than a fourth distance between the lower portion of the contact and the second bit line.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
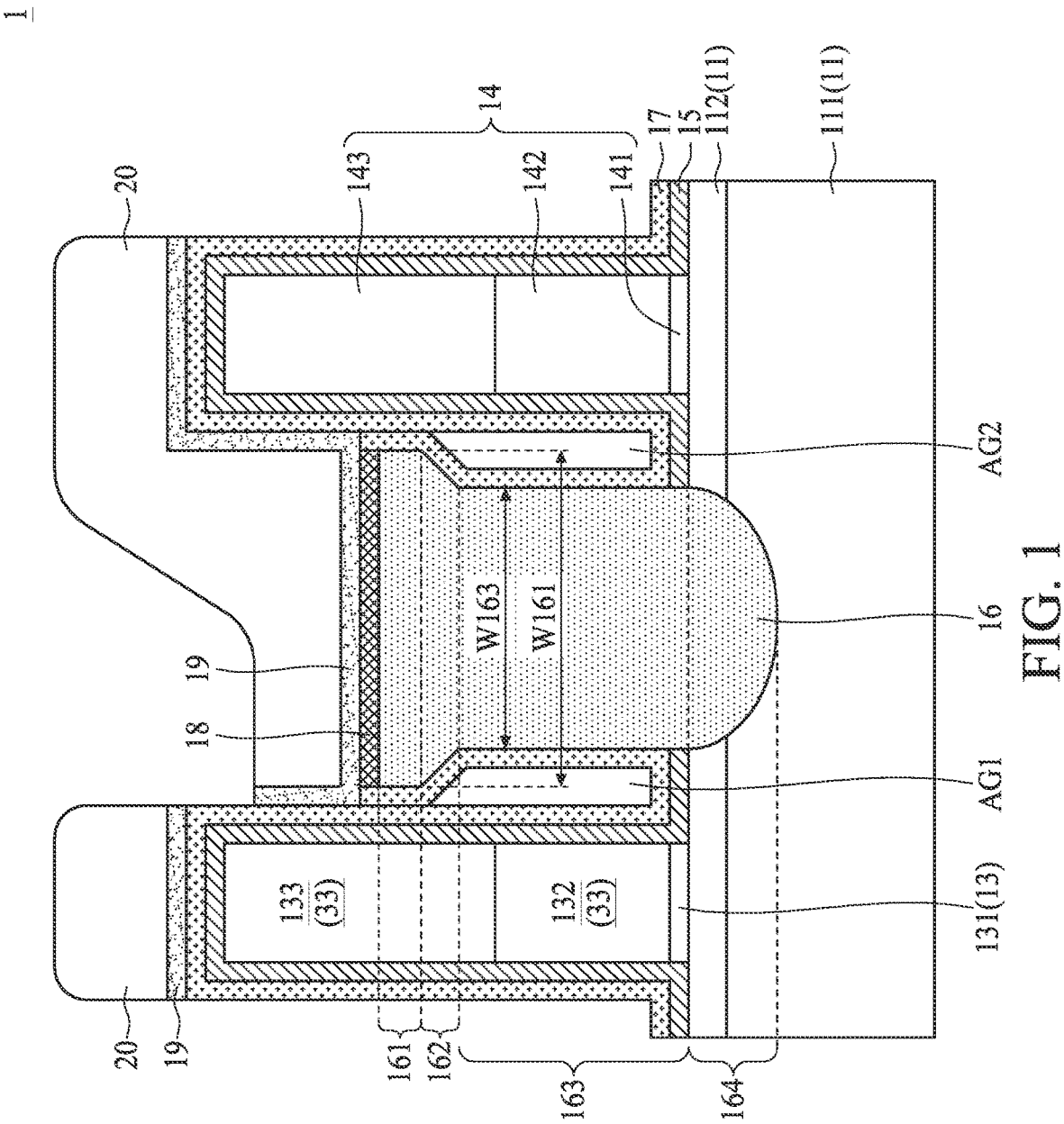
FIG. 1 is a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor structure 1 in accordance with some embodiments of the present disclosure. In some embodiments, the semiconductor structure 1 includes a substrate 11, a first bit line 13, a second bit line 14, a contact 16, a dielectric layer 17, air gaps AG1 and AG2, and a landing pad 20. The first bit line 13 and the second bit line 14 are disposed adjacently on the substrate 11. In some embodiments, the substrate 11 includes different components and/or one or more electrical devices. In some embodiments, the substrate 11 is a semiconductor substrate. In some embodiments, the substrate 11 includes a transistor in an active region. In some embodiments, the first bit line 13 and the second bit line 14 are disposed on the substrate 11 in the active region. In some embodiments, the first bit line 13 or the second bit line 14 is electrically connected to the transistor.

In some embodiments, the substrate 11 includes a silicon portion 111 and an insulating portion 112 disposed over the silicon portion 111. In some embodiments, the insulating portion 112 provides electrical isolation between the silicon portion 111 and the first bit line 13 and/or between the silicon portion 111 and the second bit line 14. In some embodiments, a top surface of the silicon portion 111 is not planar. In some embodiments, the insulating portion 112 provides a planar surface for subsequent processing. In some embodiments, the formation of the first bit line 13 and the second bit line 14 is performed on the planar surface of the insulating portion 112. In some embodiments, the insulating portion 112 includes silicon nitride.

In some embodiments, the first bit line 13 includes a nitride layer 131, a metal layer 132 and a mask layer 133 stacked in sequence on the substrate 11. In some embodiments, the nitride layer 131 includes metal nitride (e.g., titanium nitride). In some embodiments, the nitride layer 131 functions as an adhesion layer. In some embodiments, the metal layer 132 includes tungsten. In some embodiments, the mask layer 133 includes silicon nitride. In some embodiments, the second bit line 14 includes a nitride layer 141, a metal layer 142 and a mask layer 143 stacked in sequence on the substrate 11. In some embodiments, the second bit line 14 is similar to the first bit line 13, and description is not repeated.

In some embodiments, the semiconductor structure 1 further includes a spacer layer 15 disposed over the substrate 11, the first bit line 13 and the second bit line 14. In some embodiments, the spacer layer 15 covers a top and sidewalls of the first bit line 13, and/or a top and sidewalls of the second bit line 14, as shown in FIG. 1. In some embodiments, the top of the first bit line 13 is exposed through the spacer layer 15, and/or the top of the second bit line 14 is exposed through the spacer layer 15 (not shown). In some embodiments, the spacer layer 15 includes silicon nitride.

In some embodiments, the contact 16 is disposed on and in the substrate 11. In some embodiments, the contact 16 penetrates through the insulating portion 112 and is electrically connected to the silicon portion 111. In some embodiments, the contact 16 is disposed at an edge of the active region of the substrate 111 from a top view perspective. In some embodiments, the contact 16 is tapered toward the substrate 11. In some embodiments, the contact 16 is configured in a T-shape. In some embodiments, a vertical distance between a top of the contact 16 and the substrate 11 is greater than a vertical distance between a top of the metal layer 132 of the first bit line 13 and the substrate 11. In some embodiments, a vertical distance between the top of the contact 16 and the top of the metal layer 132 of the first bit line 13 is between 5 and 45 nanometers. In some embodiments, the vertical distance between the top of the contact 16 and the substrate 11 is greater than a vertical distance between a top of the metal layer 142 of the second bit line 14 and the substrate 11. In some embodiments, a vertical distance between the top of the contact 16 and the top of the metal layer 142 of the second bit line 14 is between 5 and 45 nanometers. In some embodiments, a vertical distance between the top of the first bit line 13 and the substrate 11 is greater than the vertical distance between the top of the contact 16 and the substrate 11. In some embodiments, the vertical distance between the top of the first bit line 13 and the substrate 11 is 90 to 130 nanometers greater than the vertical distance between the top of the contact 16 and the substrate 11. In some embodiments, a vertical distance between a top of the second bit line 14 and the substrate 11 is similar to the vertical distance between the first bit line 13 and the substrate 11, and height comparisons between the second bit line 14 and the contact 16 are not repeated here.

For ease of illustration, the contact 16 is divided into four portions from top to bottom: a top portion 161, an upper portion 162, a lower portion 163 and a bottom portion 164. The top portion 161 is connected to the upper portion 162, which is connected to the lower portion 163, which is connected to the bottom portion 164. In some embodiments, the top portion 161, the upper portion 162 and the lower portion 163 are disposed above the substrate 11. In some embodiments, the bottom portion 164 is disposed in the substrate 11. In some embodiments, the top portion 161 is wider than the lower portion 163. In some embodiments, a width W161 of the top portion 161 is greater than a width W163 of the lower portion W163. In some embodiments, a width of the upper portion 162 decreases from the top portion 161 to the lower portion 163. In some embodiments, the width W161 of the upper portion 161 remains constant from a top of the contact 16 to the upper portion 162. In some embodiments, the width W163 of the lower portion 163 remains constant from the upper portion 162 to the bottom portion 164. In some embodiments, the bottom portion 164 is tapered toward a bottom of the contact 16 inside the substrate 11. In some embodiments, the configuration of the contact 16 more closely resembles a perfect T-shape. In some embodiments, the contact 16 does not have the upper portion 162, and the lower portion 163 is directly connected to the top portion 161 (not shown). In some embodiments, the contact 16 includes polysilicon. In some embodiments, the contact 16 includes doped polysilicon.

In some embodiments, a horizontal distance between the top portion 161 and the first bit line 13 is less than a horizontal distance between the lower portion 163 and the first bit line 13. Similarly, in some embodiments, a horizontal distance between the top portion 161 of the contact 16 and the second bit line 14 is less than a horizontal distance between the lower portion 163 of the contact 16 and the second bit line 14. In some embodiments, a horizontal distance between the upper portion 162 and the first bit line 13 gradually increases from a connecting point of the upper portion 162 and the top portion 161 toward a connecting point of the upper portion 162 and the lower portion 163.

Similarly, in some embodiments, a horizontal distance between the upper portion 162 and the second bit line 14 gradually increases from the connecting point of the upper portion 162 and the top portion 161 toward the connecting point of the upper portion 162 and the lower portion 163.

In some embodiments, the dielectric layer 17 is disposed conformally over the first bit line 13, the second bit line 14, the substrate 11 and sidewalls of the contact 16. In some embodiments, a first portion of the dielectric layer 17 surrounding the top portion 161 of the contact 16 physically contacts a fourth portion of the dielectric layer 17 surrounding the first bit line 13. In some embodiments, a third portion of the dielectric layer 17 surrounding the lower portion 163 of the contact 16 is separated from the fourth portion of the dielectric layer 17 surrounding the first bit line 13. In some embodiments, a second portion of the dielectric layer 17 surrounding the upper portion 162 of the contact 16 may have a top point contacting the fourth portion of the dielectric layer 17. In some embodiments, a distance between the second portion and the fourth portion increases at positions of decreasing vertical distance from the substrate 11.

In some embodiments, there may be no boundary or interface between the first portion and the fourth portion of the dielectric layer 17. In some embodiments, the dielectric layer 17 is a nitride layer. In some embodiments, the dielectric layer 17 include silicon nitride. In some embodiments, a thickness of the dielectric layer 17 is between 3 and 6 nanometers.

In some embodiments, the first portion of the dielectric layer 17 surrounding the top portion 161 of the contact 16 physically contacts a fifth portion of the dielectric layer 17 surrounding the second bit line 14. In some embodiments, a distance between the second portion of the dielectric layer 17 surrounding the upper portion 162 of the contact 16 and the fifth portion of the dielectric layer 17 surrounding the second bit line 14 increases at positions of decreasing vertical distance from the substrate. In some embodiments, the connecting point between the first portion and the second portion (or a top point of the second portion) of the dielectric layer 17 may contact the fifth portion of the dielectric layer 17. In some embodiments, the third portion of the dielectric layer 17 surrounding the lower portion 163 of the contact 16 is separated from the fifth portion of the dielectric layer 17 surrounding the second bit line 14. In some embodiments, there may be no boundary between the first portion and the fifth portion of the dielectric layer 17.

The air gap AG1 is sealed by the dielectric layer 17. In some embodiments, the air gap AG1 is defined by the contact 16, the first bit line 13 and the substrate 11. More specifically, in some embodiments, the air gap AG1 is defined by the upper portion 162, the lower portion 163, the substrate 11 and the sidewall of the first bit line 13. In some embodiments, the air gap AG1 is mostly disposed between the lower portion 163 of the contact 16 and the first bit line 13. In some embodiments, a top of the air gap AG1 is at a same level as a top of the metal layer 132. In some embodiments, the air gap AG1 is substantially taller than the metal layer 132 of the first bit line 13 as measured from the substrate 11. In other words, in some embodiments, a vertical distance between the top of the air gap AG1 and the substrate 11 is greater than or equal to the vertical distance between the top of the metal layer 132 of the first bit line 13 and the substrate 11. In some embodiments, a vertical distance between the top of the metal layer 132 and the top of the air gap AG1 is between 0 and 10 nanometers.

The air gap AG2 is sealed by the dielectric layer 17. In some embodiments, the air gap AG2 is defined by the contact 16, the second bit line 14 and the substrate 11. More specifically, in some embodiments, the air gap AG2 is defined by the upper portion 162, the lower portion 163, the substrate 11 and the sidewall of the second bit line 14. In some embodiments, the air gap AG2 is mostly disposed between the lower portion 163 of the contact 16 and the second bit line 14. In some embodiments, a top of the air gap AG2 is at a same level as a top of the metal layer 142. In some embodiments, a vertical distance between the top of the air gap AG2 and the substrate 11 is substantially greater than a vertical distance between the top of the metal layer 142 of the second bit line 14 and the substrate 11. In other words, in some embodiments, the vertical distance between the top of the air gap AG2 and the substrate 11 is equal to or greater than the vertical distance between the top of the metal layer 142 of the second bit line 14 and the substrate 11. In some embodiments, a vertical distance between the top of the metal layer 142 and the top of the air gap AG2 is between 0 and 10 nanometers.

In some embodiments, the semiconductor structure 1 further includes a contact layer 18 disposed on the contact 16. In some embodiments, the contact layer 18 is a cobalt layer. In some embodiments, the contact layer 18 includes cobalt silicon. In some embodiments, the contact layer 18 is surrounded by the dielectric layer 17. In some embodiments, the contact layer 18 entirely overlaps the contact 16. In some embodiments, the contact layer 18 functions to tune an electrical resistance of the contact 16.

In some embodiments, the semiconductor structure 1 includes a plurality of contacts 16 and a plurality of landing pads 20 correspondingly. In some embodiments, the semiconductor structure 1 includes a plurality of adhesion layers 19 corresponding to the plurality of landing pads 20. In some embodiments, the adhesion layers 19 are for a purpose of increasing adhesion between the landing pad 20 and the first bit line 13 and between the landing pad 20 and the second bit line 14, in order to prevent peeling off of the landing pads 20. For ease of illustration, only the landing pad 20 electrically connected to the contact 16 shown in FIG. 1 and the adhesion layer 19 disposed between the contact 16 and the landing pad 20 are discussed in detail.

In some embodiments, the adhesion layer 19 is continuously disposed over the contact 16 and an adjacent bit line (e.g., the second bit line 14 in the embodiment shown in FIG. 1). In some embodiments, the adhesion layer 19 contacts the contact layer 18, a top of the first portion of the dielectric layer 17, and a portion of the fifth portion of the dielectric layer 17. In some embodiments, the adhesion layer 19 contacts a portion of the dielectric layer 17 on the top of the second bit line 14. In some embodiments, the adhesion layer 19 further contacts a portion of the dielectric layer 17 on the sidewall of the second bit line 14.

In some embodiments, the landing pad 20 is disposed over the adhesion layer 19. In some embodiments, the landing pad 20 entirely overlaps the adhesion layer 19. In some embodiments, the landing pad 20 covers an entire top surface of the contact 16 and at least a portion of a top surface of the second bit line 14 in a cross-sectional view as shown in FIG. 1.

Figure 2:
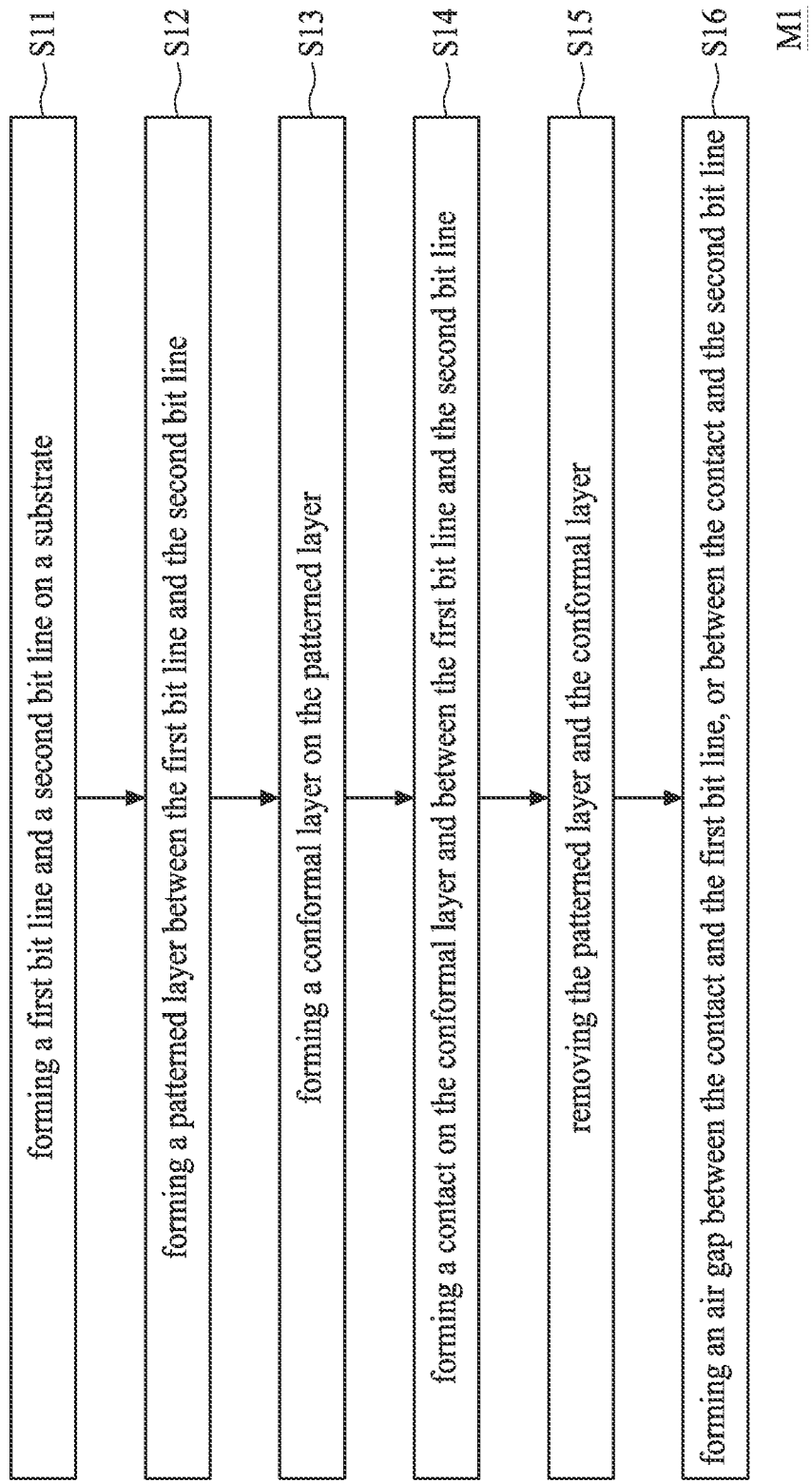
FIG. 2 is a flow diagram illustrating a method of manufacturing a semiconductor structure in accordance with some embodiments of the present disclosure.

FIG. 2 is a flow diagram of a method M1 for manufacturing a semiconductor structure 2, which is similar to the semiconductor structure 1 shown in FIG. 1. The method M1 includes: (S11) forming a first bit line and a second bit line on a substrate; (S12) forming a patterned layer between the first bit line and the second bit line; (S13) forming a conformal layer on the patterned layer; (S14) forming a contact on the conformal layer and between the first bit line and the second bit line; (S15) removing the patterned layer and the conformal layer; and (S16) forming an air gap between the contact and the first bit line, or between the contact and the second bit line. In some embodiments, the semiconductor structure 1 is manufactured according to the method M1.

In order to further illustrate concepts of the present disclosure, various embodiments are provided below. For a purpose of clarity and simplicity, reference numbers of elements with same or similar functions are repeatedly used in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

Figure 3:
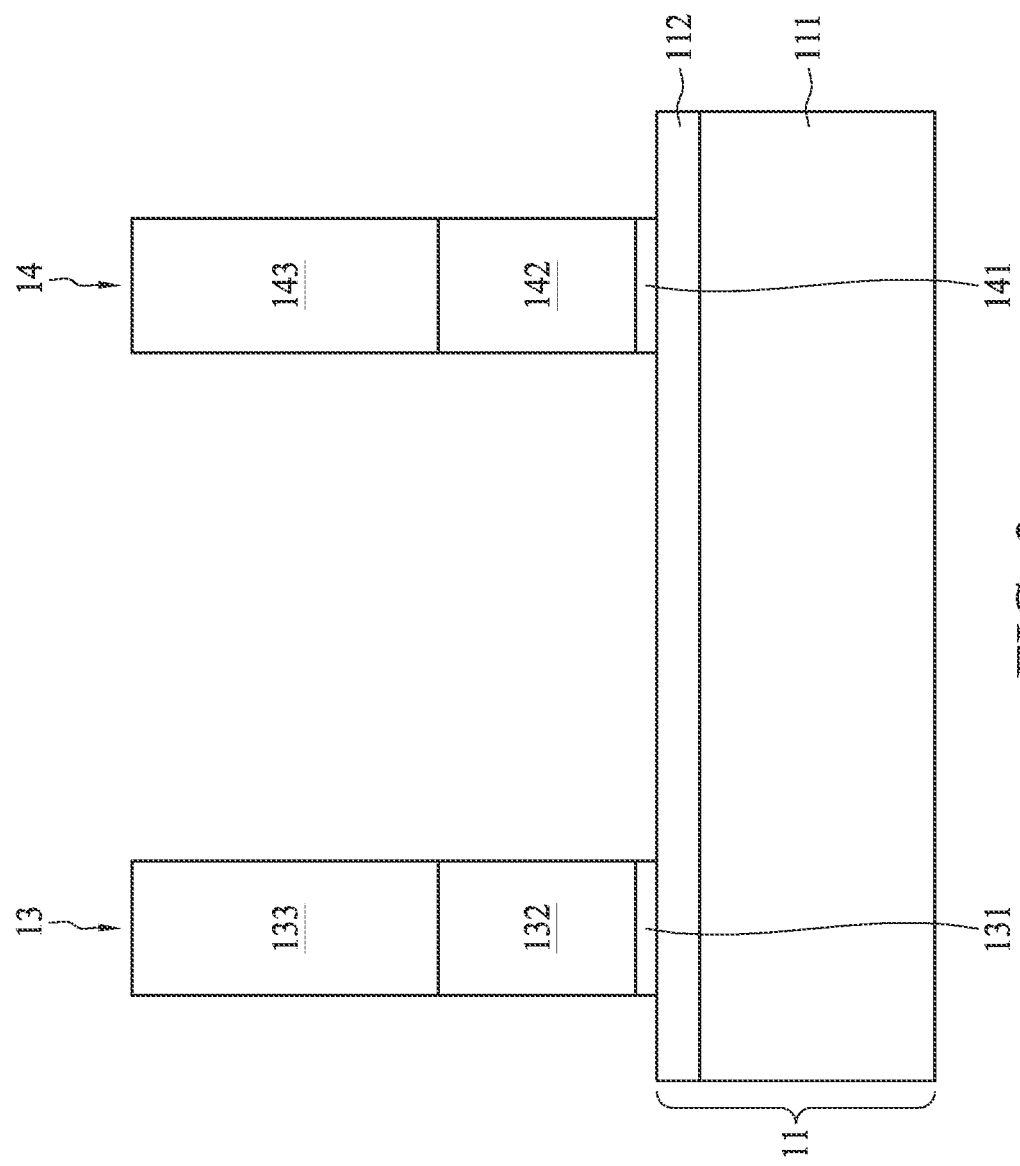
FIGS. 3 to 18 illustrate cross-sectional views of intermediate stages in the formation of a semiconductor structure in accordance with some embodiments of the present disclosure.

Referring to FIG. 3, in accordance with some embodiments of the present disclosure and the operation S11 of the method M1, the first bit line 13 and the second bit line 14 are formed on the substrate 11. In some embodiments, the first bit line 13 and the second bit line 14 are adjacent. In some embodiments, the first bit line 13 is a multi-layered structure. In some embodiments, the first bit line 13 includes a nitride layer 131, a metal layer 132 and a mask layer 133 stacked in sequence on the substrate 11. In some embodiments, the second bit line 14 is formed concurrently with the first bit line 13. In some embodiments, the second bit line 14 is similar to the first bit line 13 and includes a nitride layer 141, a metal layer 142 and a mask layer 143 stacked in sequence on the substrate 11.

A height of the metal layer 132 and a height of the metal layer 142 can be adjusted and may vary according to different generations of different devices. In some embodiments, the height of the metal layer 132 is between 15% and 20% of a height of the first bit line 13. Similarly, in such embodiments, the height of the metal layer 142 is between 15% and 20% of a height of the second bit line 14. However, the disclosure is not limited thereto. Details of arrangements of stacked materials of the first bit line 13 and the second bit line 14 are not limited herein and can be adjusted according to different applications.

In some embodiments, the operation S11 includes: (S111) performing a first blanket deposition to form a blanket nitride layer over the substrate 11; (S112) performing a second blanket deposition to form a blanket metal layer over the blanket nitride layer; (S113) performing a third blanket deposition to form a blanket mask layer over the blanket metal layer; and (S114) patterning the blanket nitride layer, the blanket metal layer and the blanket mask layer to form a plurality of bit lines. It should be noted that the first bit line 13 and the second bit line 14 are exemplary of the plurality of bit lines. The semiconductor structures of the present invention may include more than two bit lines.

In some embodiments, the method M1 further includes receiving the substrate 11. In some embodiments, the substrate 11 undergoes multiple operations prior to the formation of the first bit line 13 and the second bit line 14. In some embodiments, the substrate 11 includes an insulating portion 112 formed on a silicon portion 111. In some embodiments, the insulating portion 112 is formed by deposition of a nitride layer. In some embodiments, the insulating portion 112 provides electrical insulation between the bit lines and the silicon portion 111. In some embodiments, the silicon portion 111 includes uneven surface from previous processing, and the insulating portion 112 is in contact with the uneven surface of the silicon portion 111 and provides a planar surface for later operations of the method M1. For simplicity of illustration, the insulating portion 112 is not depicted in FIGS. 4 to 21.

Figure 4:
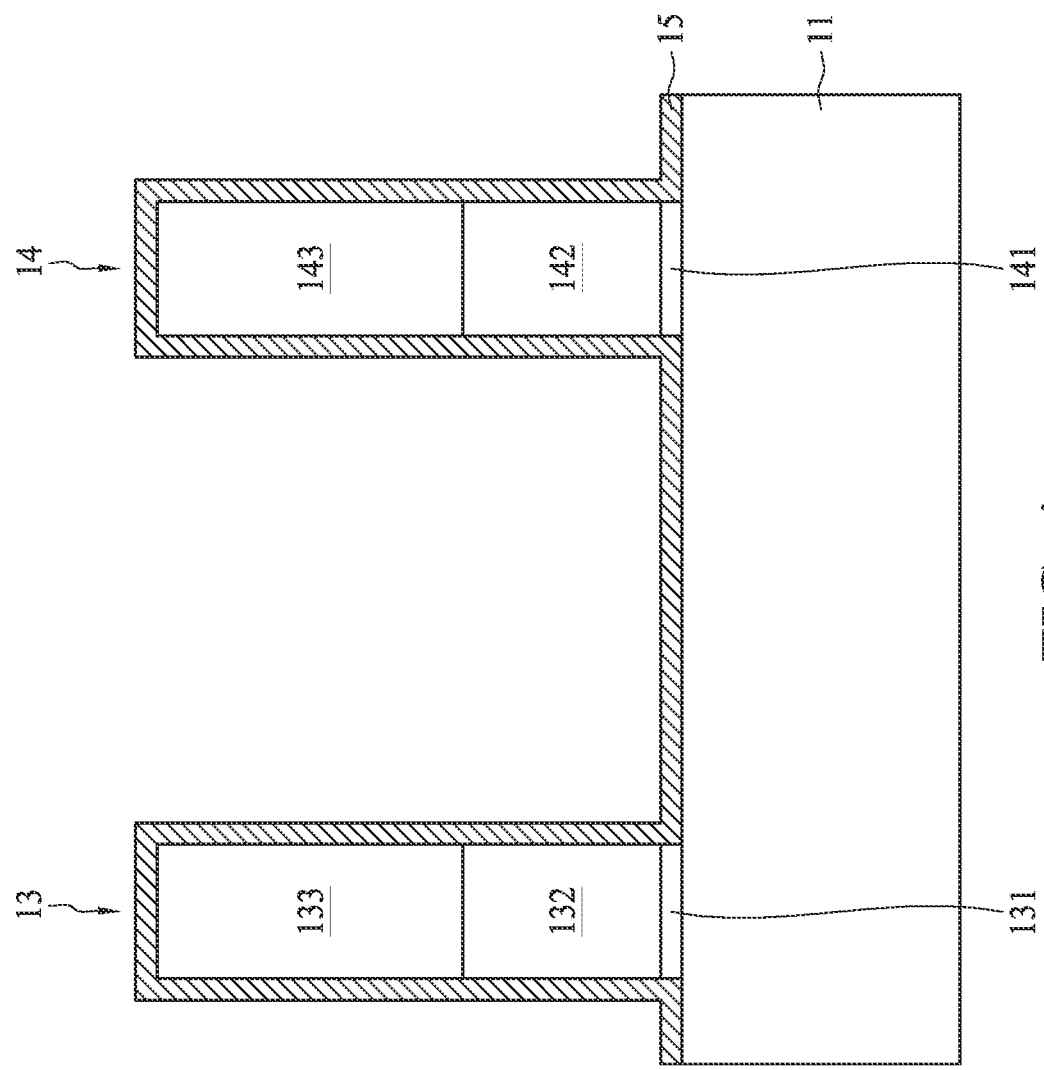

Referring to FIG. 4, in accordance with some embodiments of the present disclosure, the method M1 may further include forming a spacer layer 15. In some embodiments, the spacer layer 15 is formed over the substrate 11, the first bit line 13 and the second bit line 14. In some embodiments, the spacer layer 15 is conformal to a profile of the first bit line 13, the second bit line 14, and the substrate 11. In some embodiments, the spacer layer 15 is formed by a deposition of a nitride layer. In some embodiments, a thickness of the spacer layer 15 is between 1 and 3 nanometers. In some embodiments, the spacer layer 15 is formed by an atomic layer deposition (ALD).

Referring to FIGS. 5 to 8, in accordance with some embodiments of the present disclosure and the operation S12 of the method M1, a patterned layer O1' is formed between the first bit line 13 and the second bit line 14. The patterned layer O1' covers the substrate 11 and surrounds a lower portion of the first bit line 13 and a lower portion of the second bit line 14. In some embodiments, the operation S12 includes multiple steps as shown in FIGS. 5 to 8. In some embodiments, the operation S12 includes: (S121) forming a first sacrificial layer O1 over the substrate 11, the first bit line 13, and the second bit line 14; (S122) forming a photoresist PR1 over the substrate 11 covering the first sacrificial layer O1; (S123) removing a portion of the photoresist PR1 and a portion of the first sacrificial layer O1, thereby exposing an upper portion of the first bit line 13 and an upper portion of the second bit line 14; and (S124) removing a remaining portion of the photoresist PR1.

Figure 5:
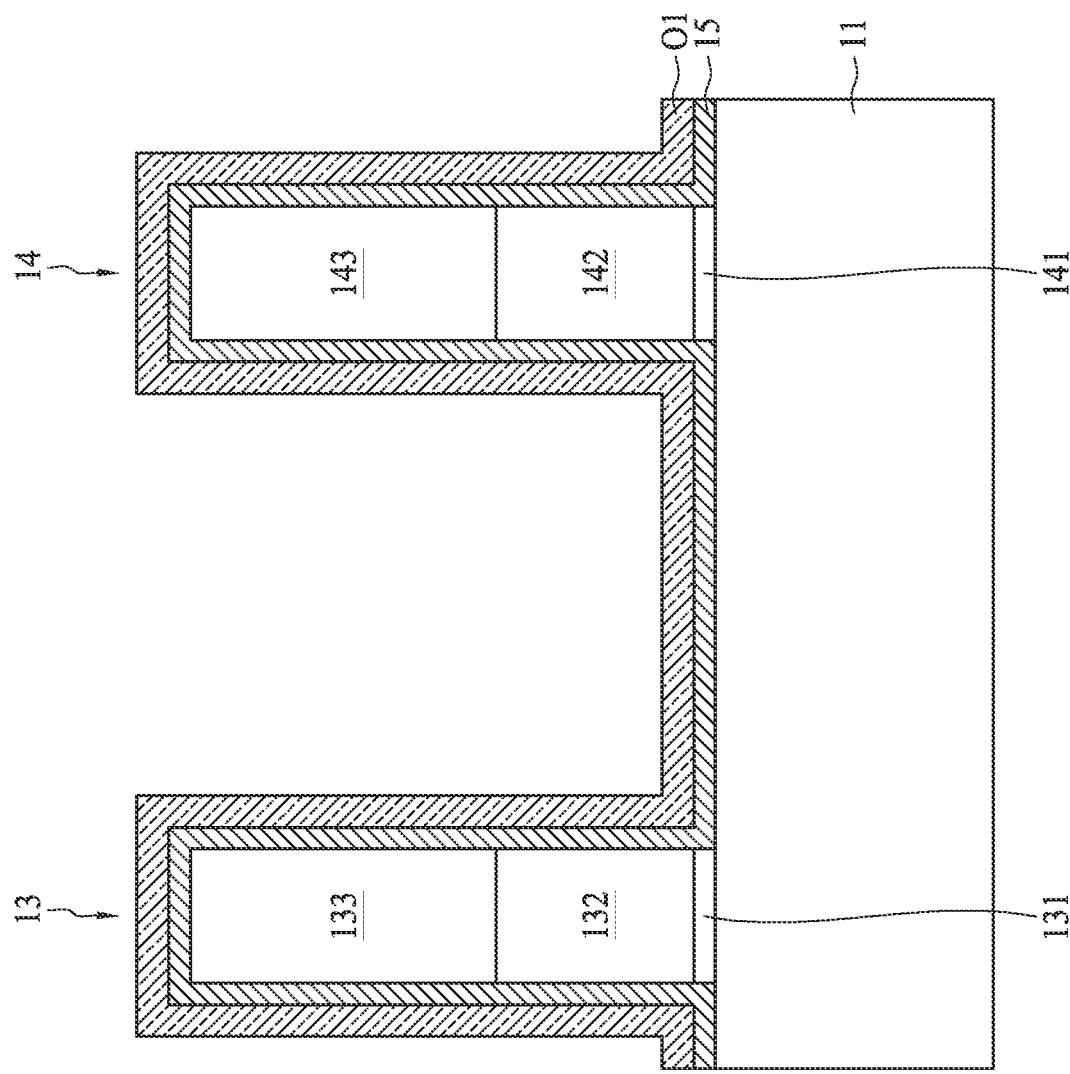

Referring to FIG. 5, in accordance with some embodiments of the present disclosure and the step S121 of the operation S12 of the method M1, the first sacrificial layer O1 is formed conformally over the substrate 11. In some embodiments, the first sacrificial layer O1 is formed by a conformal deposition. In some embodiments, the first sacrificial layer O1 is formed by an atomic layer deposition (ALD). In some embodiments, the first sacrificial layer O1 conformally covers the substrate 11, the first bit line 13 and the second bit line 14. In some embodiments, the first sacrificial layer O1 has a profile conformal to the spacer layer 15. In some embodiments, the first sacrificial layer O1 is a dielectric layer. In some embodiments, the first sacrificial layer O1 is an oxide layer. In some embodiments, the first sacrificial layer O1 includes silicon oxide. In some embodiments, a thickness of the first sacrificial layer O1 is greater than or equal to the thickness of the spacer layer 15. In some embodiments, the thickness of the first sacrificial layer O1 is between 1 and 5 nanometers.

Figure 6:
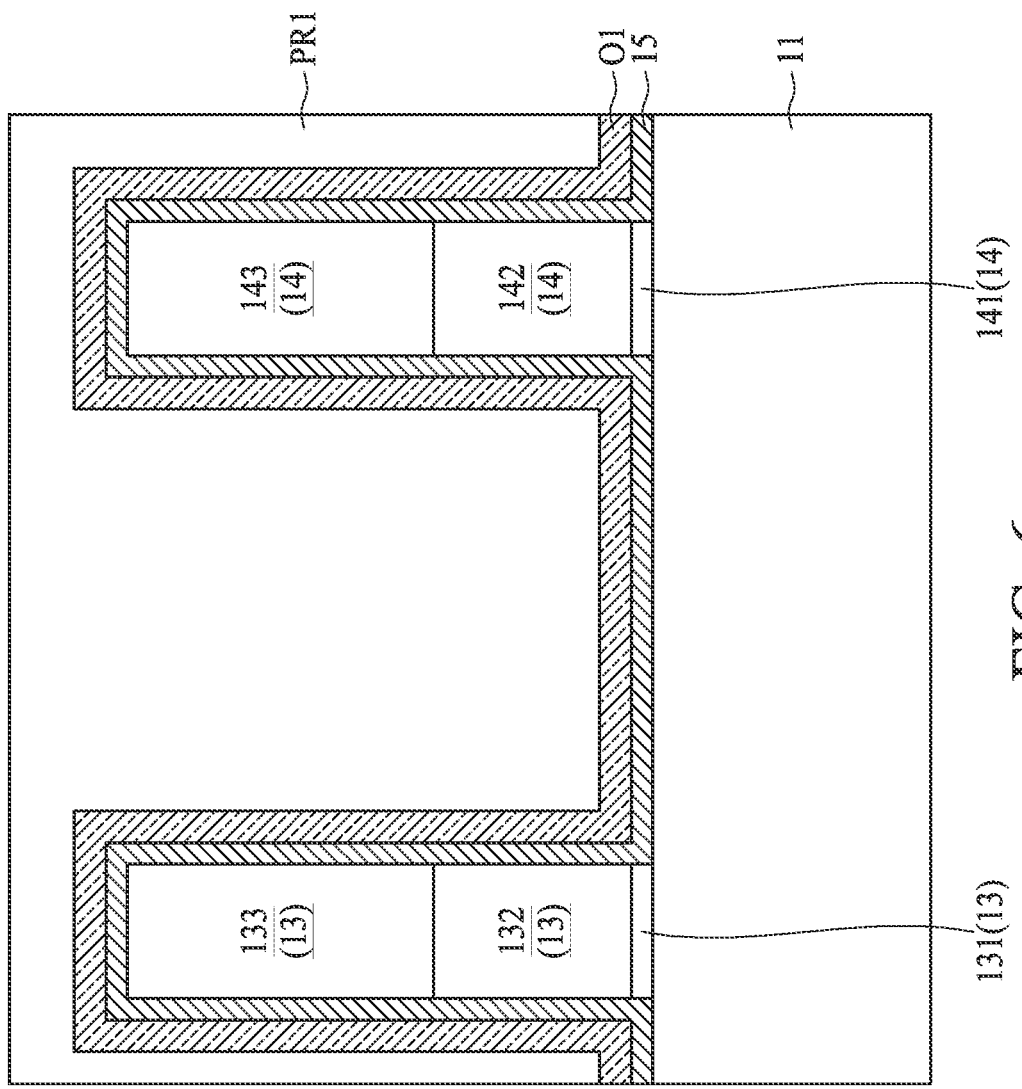

Referring to FIG. 6, in accordance with some embodiments of the present disclosure and the step S122 of the operation S12 of the method M1, the photoresist PR1 is formed over the substrate 11 and covers the first sacrificial layer O1. The photoresist PR1 serves to define a height of the patterned layer O1' to be formed later in the process. In some embodiments, the photoresist PR1 can be another type of mask layer or protective layer.

Figure 7:
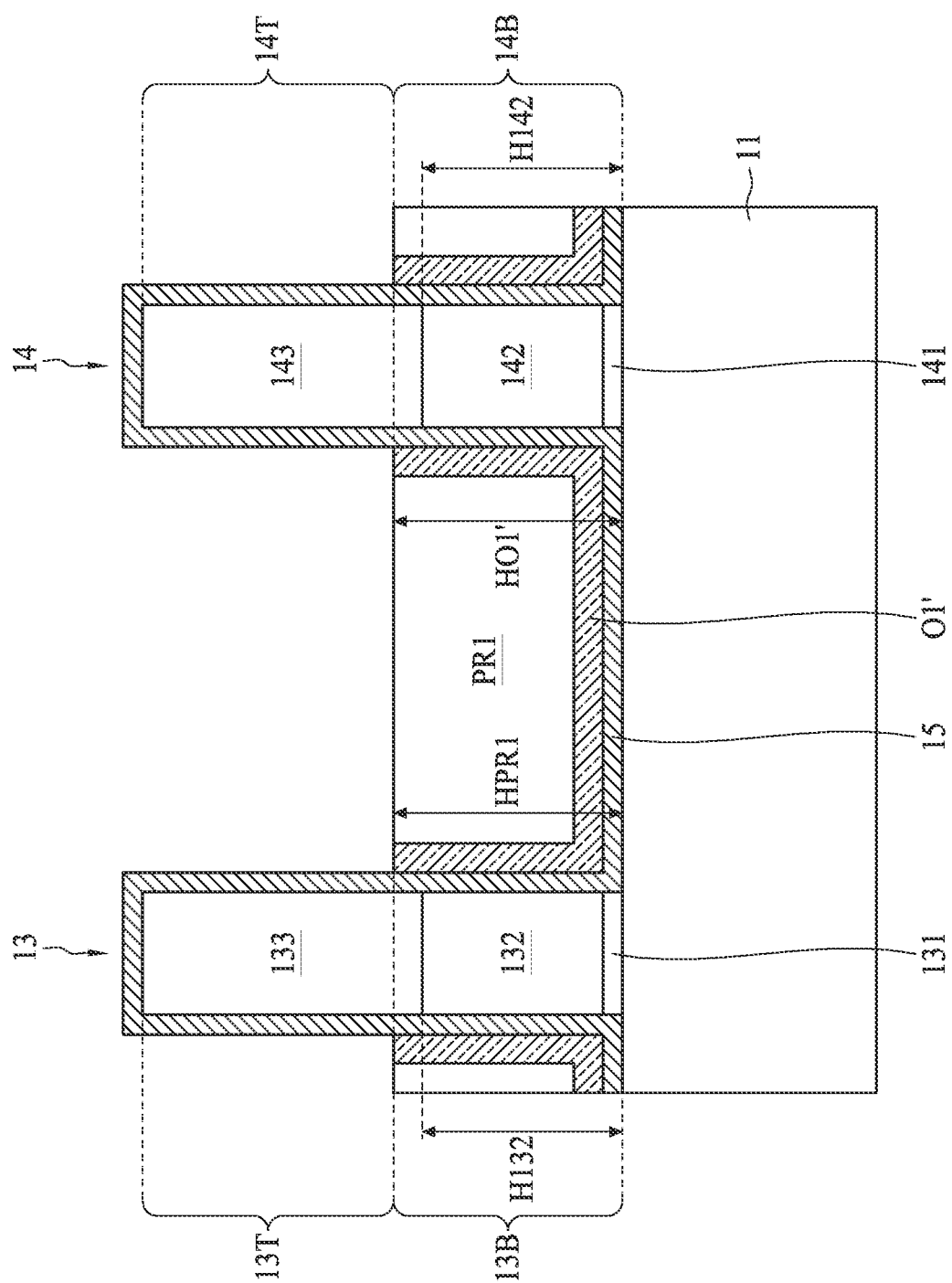
Figure 8:
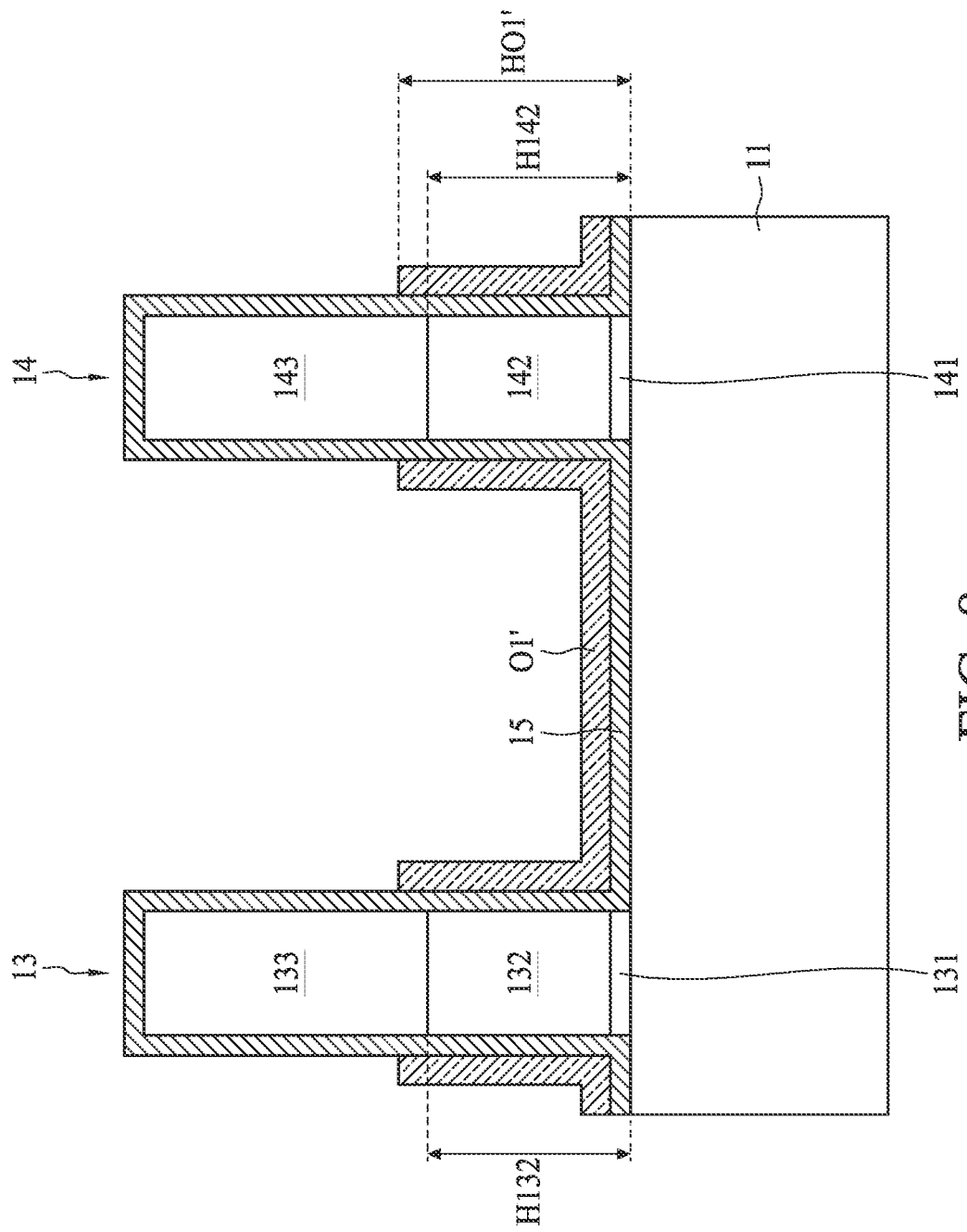

Referring to FIGS. 7 to 8, in accordance with some embodiments of the present disclosure and the steps S123 to S124 of the operation S12 of the method M1, a portion of the photoresist PR1 and a portion of the first sacrificial layer O1 surrounding an upper portion 13T of the first bit line 13 and an upper portion 14T of the second bit line 14 are removed, thereby forming the patterned layer O1'. The patterned layer O1' is formed from the first sacrificial layer O1, as the portion of the first sacrificial layer O1 remaining after the step S123. The upper portion 13T of the first bit line 13 and the upper portion 14T of the second bit line 14 are exposed through the patterned layer O1', and a lower portion 13B of the first bit line 13 and a lower portion 14B of the second bit line 14 are surrounded by the patterned layer O1'. In some embodiments, a first boundary between the upper portion 13T and the lower portion 13B of the first bit line 13 is defined by the patterned layer O1'; similarly, a second boundary between the upper portion 14T and the lower portion 14B of the second bit line 14 is also defined by the patterned layer O1'. In some embodiments, the first boundary is at or above a top of the metal layer 132. In some embodiments, the second boundary is at or above a top of the metal layer 142.

A height HO1' of the patterned layer O1' measured from the substrate 11 is defined by the photoresist PR1. As shown in FIG. 7, after the step S123, the photoresist PR1 has a height HPR1 measured from the substrate 11, and the height HO1' and the height HPR1 are substantially equal. In some embodiments, the height HO1' of the patterned layer O1' is designed to be equal to or greater than a height H132 of the metal layer 132 and/or a height H142 of the metal layer 142, wherein the height H132 and the height H142 are measured from the substrate 11. In some embodiments, a thickness of the patterned layer O1' (which is substantially equal to the thickness of the first sacrificial layer O1) serves to define a width of the air gap AG1 and a width of the air gap AG2 to be formed later in the process. In some embodiments, portions of the spacer layer 15 covering tops of the first bit line 13 and the second bit line 14 may be consumed during the steps S123 and S124. In some embodiments, the portions of the spacer layer 15 covering the tops of the first bit line 13 and the second bit line 14 become thinner (not shown). In some embodiments, a top of the mask layer 133 of the first bit line 13 is exposed through the spacer layer 15 after the step S123 and/or the step S124 of the operation S12. In some embodiments, a top of the mask layer 143 of the second bit line 14 is exposed through the spacer layer 15 after the step S123 and/or the step S124 of the operation S12.

Figure 9:
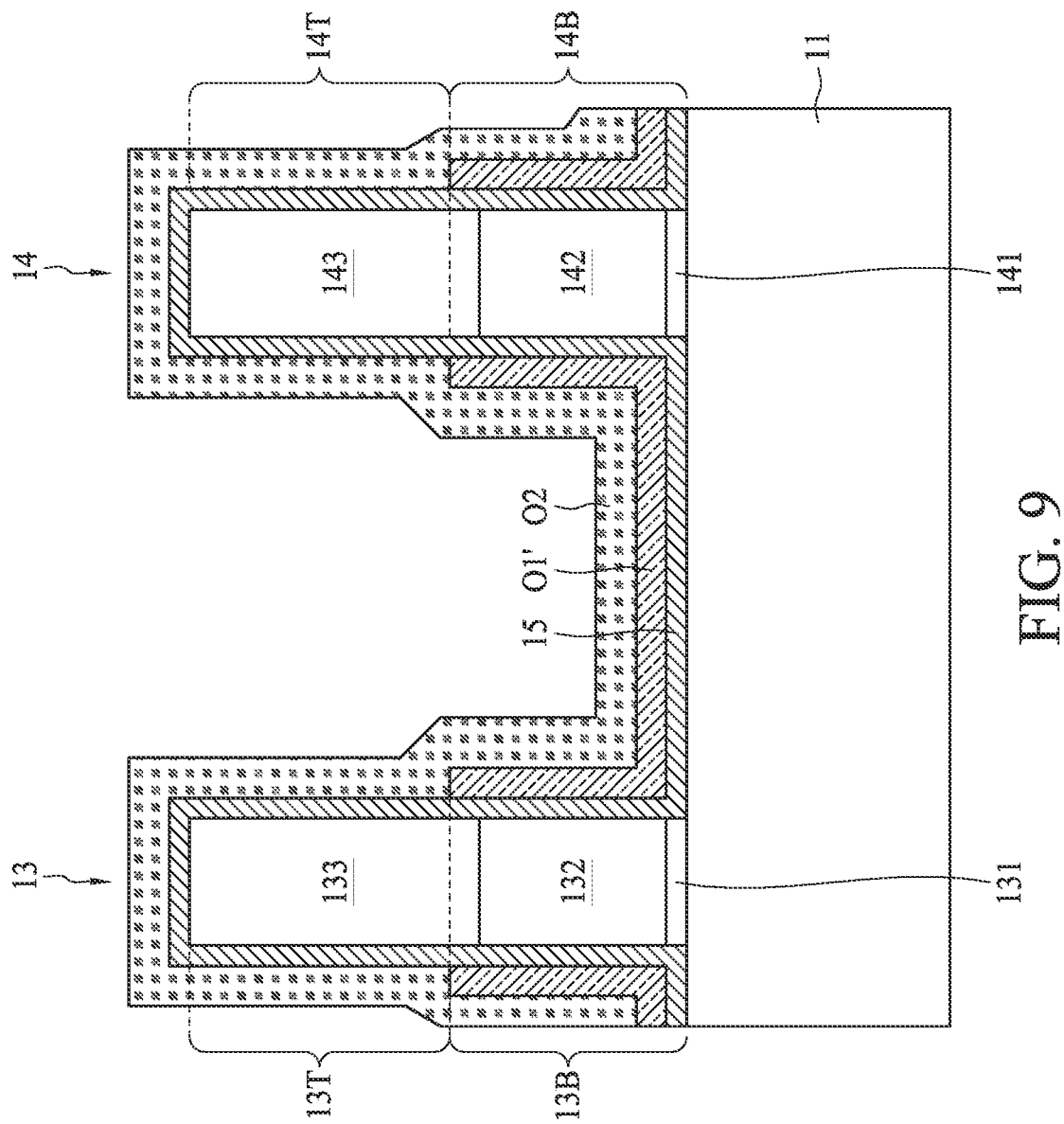

Referring to FIG. 9, in accordance with some embodiments of the present disclosure and the operation S13 of the method M1, a conformal layer O2 is formed over the substrate 11. The conformal layer O2 in other embodiments can be also referred as a second sacrificial layer. In some embodiments, the conformal layer O2 is formed by a blanket deposition. In some embodiments, the conformal layer O2 is formed by an atomic layer deposition (ALD). In some embodiments, the conformal layer O2 covers the patterned layer O1', the upper portion 13T of the first bit line 13 and the upper portion 14T of the second bit line 14. In some embodiments, the conformal layer O2 is a dielectric layer. In some embodiments, the conformal layer O2 is an oxide layer. In some embodiments, the conformal layer O2 includes a same material as the patterned layer O1'. In some embodiments, a thickness of the conformal layer O2 is greater than the thickness of the patterned layer O1'. In some embodiments, the thickness of the conformal layer O2 is between 5 and 12 nanometers. In some embodiments, the thickness of the conformal layer O2 is designed to be twice a thickness of the dielectric layer 17 to be formed later in the process. In some embodiments, the conformal layer O2 is in contact with the mask layer 133 of the first bit line 13 or the mask layer 143 of the second bit line 14 (not shown).

Figure 10:
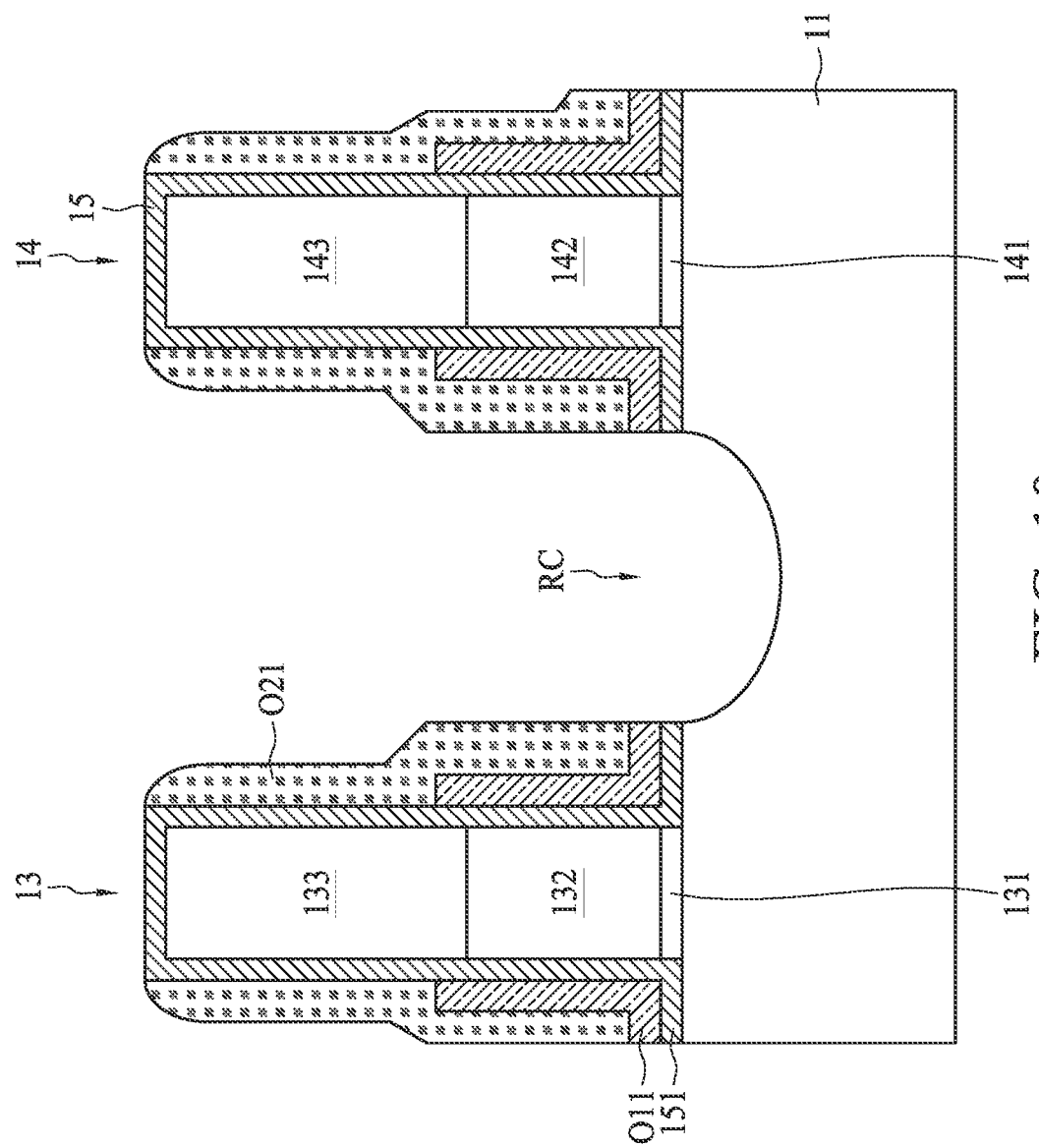

Referring to FIG. 10, in accordance with some embodiments of the present disclosure, after the operation S13, the method M1 may further include exposing the substrate 11 between the first bit line 13 and the second bit line 14. In some embodiments, lateral portions of the conformal layer O2, a lateral portion of the patterned layer O1' between the first bit line 13 and the second bit line 14, and a lateral portion of the spacer layer 15 between the first bit line 13 and the second bit line 14 are removed. In some embodiments, the lateral portions of the conformal layer O2 disposed on the substrate 11, on the top of the first bit line 13, and on the top of the second bit line 14 are removed, thereby forming an etched conformal layer O21. In some embodiments, the lateral portion of the patterned layer O1' on the substrate 11 exposed through the etched conformal layer O21 is removed, thereby forming an etched patterned layer O11. In some embodiments, the conformal layer O21 and the patterned layer O11 together can be defined as a spacer structure, which is tapered from the substrate 11 toward the top of the first bit line 13 and/or the top of the second bit line 14. In some embodiments, the lateral portion of the spacer layer 15 on the substrate 11 exposed through the conformal layer O21 and the patterned layer O11 is removed, thereby forming an etched spacer layer 151. In some embodiments, the spacer structure further includes the spacer layer 151. In some embodiments, a portion of the substrate 11 exposed through the conformal layer O21, the patterned layer O11 and the spacer layer 151 is removed to form a recess RC in the substrate 11. In some embodiments, the top of the first bit line 13 and the top of the second bit line 14 are protected by a hard mask (not shown) during the operation of exposing the substrate 11, and the portions of the spacer layer 15 covering the top of the first bit line 13 and the top of the second bit line 14 are left. Thus, in some embodiments, the patterned spacer layer 151 also covers the top of the first bit line 13 and the top of the second bit line 14. In some embodiments, the portions of the spacer layer 15 covering the top of the first bit line 13 and the top of the second bit line 14 are consumed during the operation of exposing the substrate 11, and the top of the first bit line 13 and the top of the second bit line 14 are exposed after the operation of exposing the substrate 11.

In some embodiments, the conformal layer O21 and the patterned layer O11 both include oxide and are formed by single etching operation. In some embodiments, the spacer layer 151 includes nitride and is formed by another etching operation. In some embodiments, an etchant with low oxide-to-nitride selectivity is used to remove the portions of the conformal layer O2, the patterned layer O1' and the spacer layer 15 concurrently by single etching operation. In some embodiments, removal of the portion of the substrate 11 is performed by another etching operation. In other words, in some embodiments, formation of the recess RC is performed after the formation of the spacer layer 151 by a different etching operation.

Figure 11:
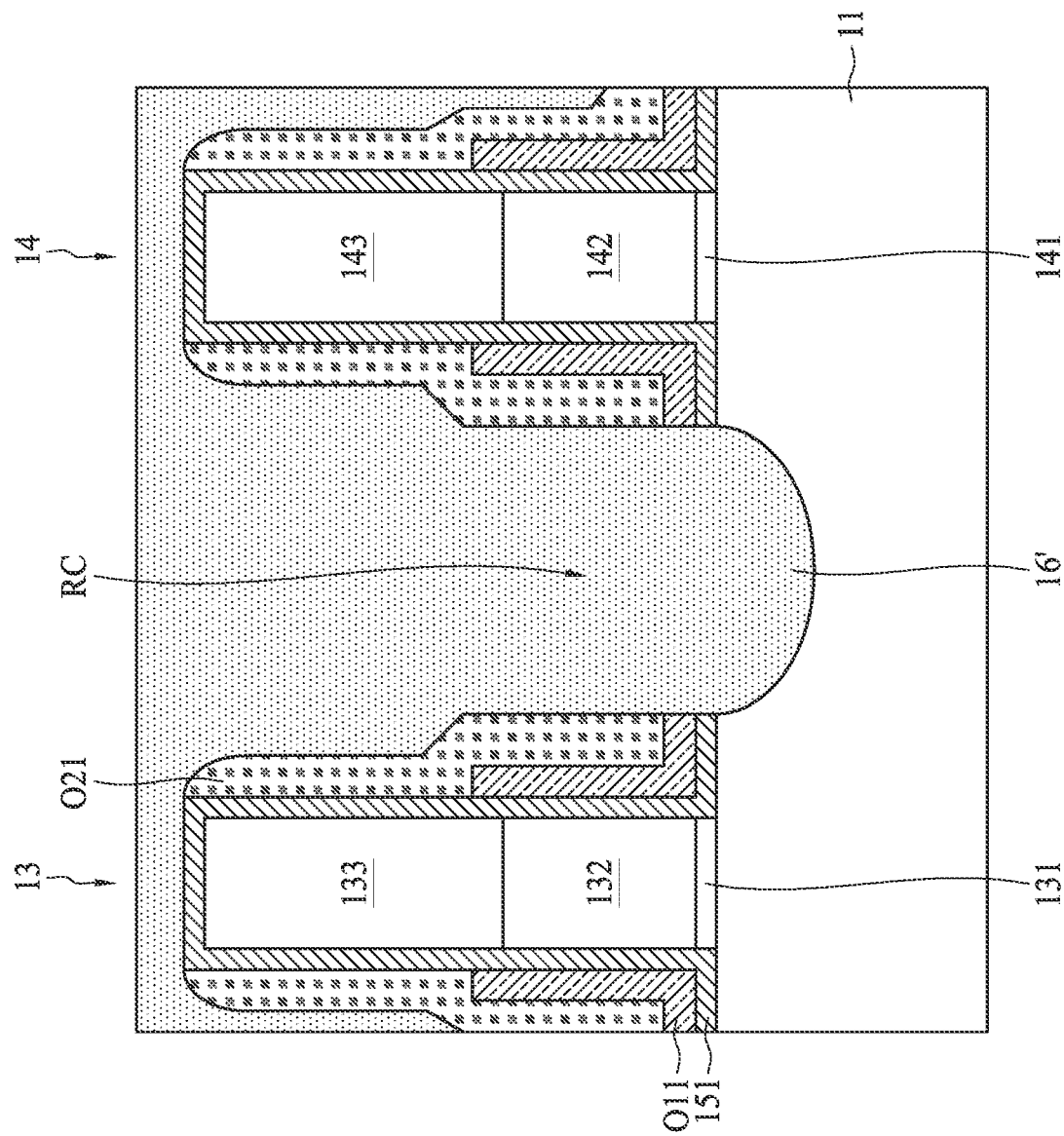
Figure 12:
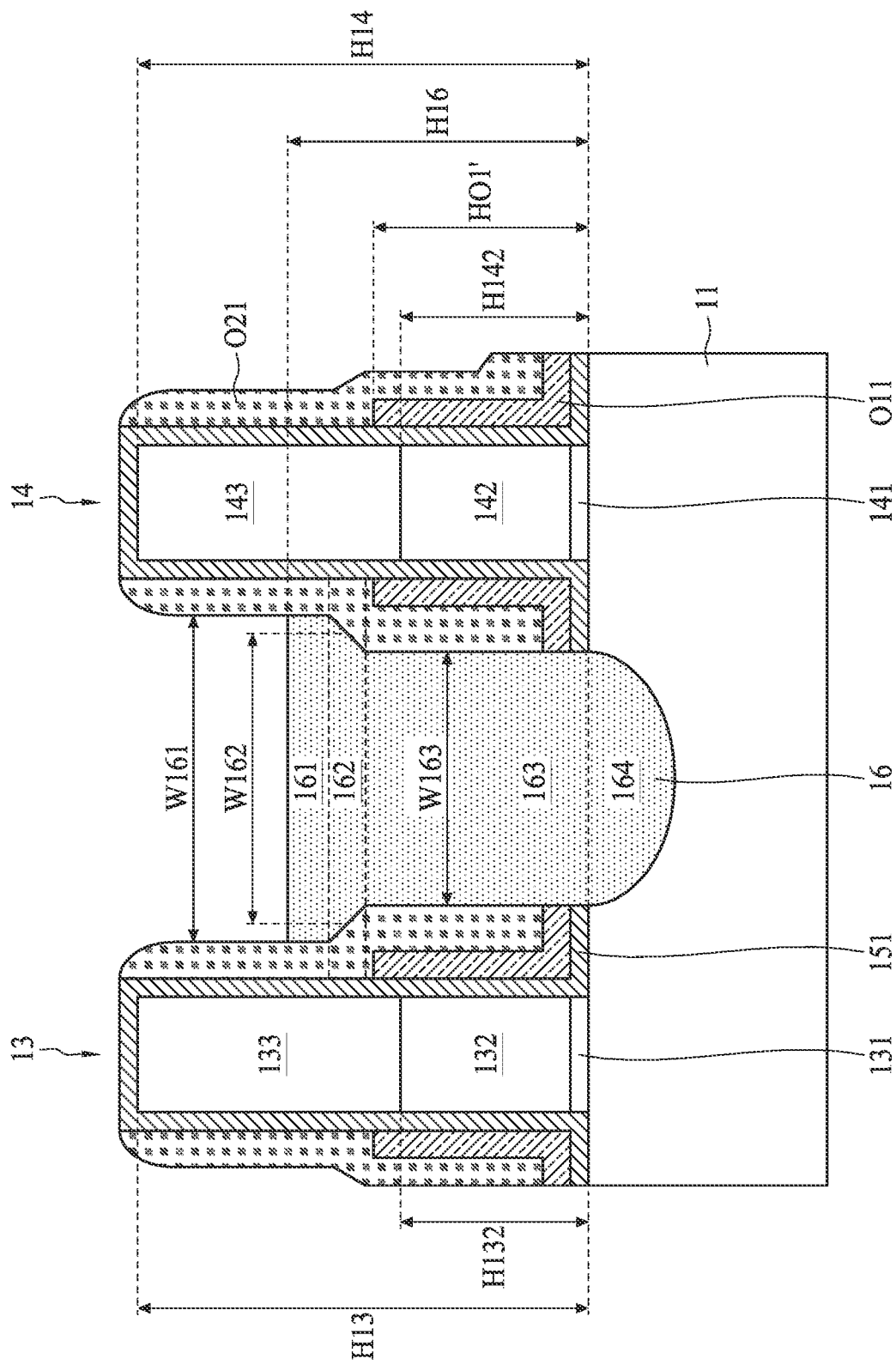

Referring to FIGS. 11 to 12, in accordance with some embodiments of the present disclosure and the operation S14 of the method M1, the contact 16 is formed on the conformal layer O21 and between the first bit line 13 and the second bit line 14. The contact 16 is formed in the recess RC in order to electrically connect to the substrate 11.

In some embodiments, the operation S14 of the method M1 includes: forming a contact material layer 16' to fill the recess RC and cover the first bit line 13 and the second bit line 14; and removing a portion of the contact material layer 16' to form the contact 16. In some embodiments, the contact material layer 16' includes doped polysilicon. In some embodiments, an etch-back operation is performed to remove the portion of the contact material layer 16'.

The contact 16 is formed in the recess RC and between the first bit line 13 and the second bit line 14 as shown in FIG. 12. In some embodiments, a height H16 of the contact 16 above the substrate 11 is greater than the height HO1' of the patterned layer O1' (or the patterned layer O11, since a height of the patterned layer O11 is equal to the height HO1', and for ease of illustration, the height HO1' also represents the height of the patterned layer O11) above the substrate 11. In some embodiments, the height H16 of the contact 16 is 5 to 35 nanometers greater than the height HO1'. In some embodiments, the height H16 of the contact 16 is less than a height H13 of the first bit line 13 and/or a height H14 of the second bit line 14. In some embodiments, the height H16 of the contact 16 is 90 to 130 nanometers less than the height H13 of the first bit line 13. In some embodiments, the height H13 of the first bit line 13 is substantially equal to the height H14 of the second bit line 14.

A profile of the contact 16 is defined by the conformal layer O21 and the patterned layer O11. Thus, the contact 16 is tapered toward the substrate 11. The contact 16 includes a top portion 161, an upper portion 162, a lower portion 163 and a bottom portion 164. A width W161 of the top portion 161 is defined by the conformal layer O21 surrounding the upper portion 13T of the first bit line 13 and the upper portion 14T of the second bit line 14. A width W163 of the lower portion 163 is defined by the conformal layer O21 and the patterned layer O11 surrounding the lower portion 13B of the first bit line 13 and the lower portion 14B of the second bit line 14. Therefore, the width W161 of the top portion 161 is greater than the width W163 of the lower portion 163. The top portion 161 and the lower portion 163 are connected by the upper portion 162. A width W162 of the upper portion 162 gradually decreases from the width W161 to the width W163 at positions of decreasing vertical distance from the substrate 11. It should be noted that the width W162 is depicted at a middle of the upper portion 162 in FIG. 12 for a purpose of illustration only. The bottom portion 164 of the contact 16 is connected to the lower portion 163 and disposed in the substrate 11, while the top portion 161, the upper portion 162 and the lower portion 163 are all disposed above the substrate 11.

Figure 13:
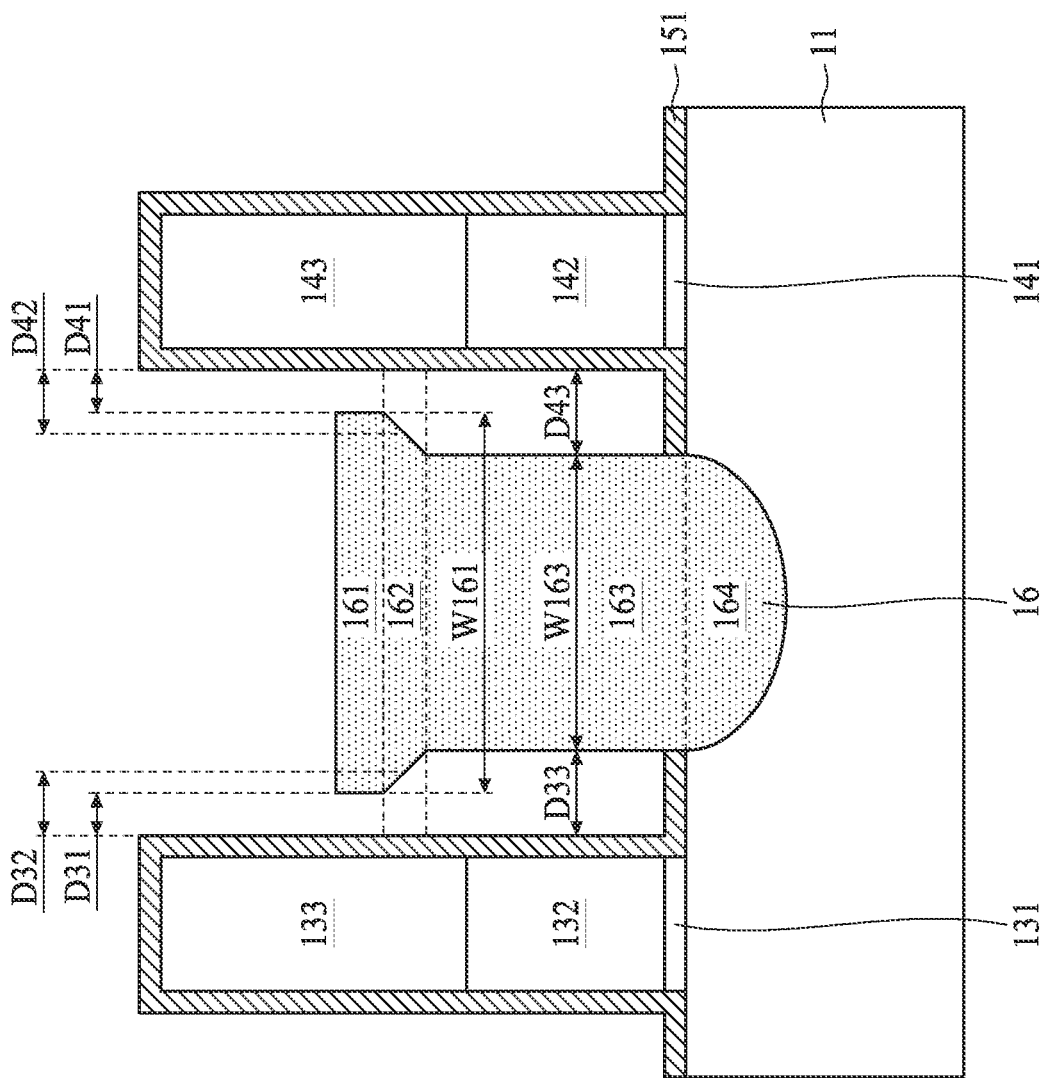

Referring to FIG. 13, in accordance with some embodiments of the present disclosure and the operation S15 of the method M1, the patterned layer O11 and the conformal layer O21 are removed. In some embodiments, a wet etching operation is performed to remove the patterned layer O11 and/or the conformal layer O21. In some embodiments, the patterned layer O11 and the conformal layer O21 are removed concurrently by one etching operation.

A distance D31 between the top portion 161 of the contact 16 and the first bit line 13 is less than a distance D33 between the lower portion 163 of the contact 16 and the first bit line 13. A distance D41 between the top portion 161 of the contact 16 and the second bit line 14 is less than a distance D43 between the lower portion 163 of the contact 16 and the second bit line 14. The distance D31 and the distance D41 are both defined by the conformal layer O21, as shown in FIG. 12, and thus, the distance D31 and the distance D41 are substantially equal, and individually are substantially equal to the thickness of the conformal layer O21. Similarly, the distance D33 and the distance D43 are both defined by the conformal layer O21 and the patterned layer O11, as shown in FIG. 12, and thus, the distance D33 and the distance D43 are substantially equal. The distance D33 and the distance D43 individually are substantially equal to a total thickness equal to a sum of the thickness of the conformal layer O21 and the thickness of the patterned layer O11. A distance D32 between the upper portion 162 and the first bit line 13 gradually increases at positions of decreasing vertical distance from the substrate 11. The distance D32 increases from the distance D31 to the distance D33. A distance D42 between the upper portion 162 and the second bit line 14 gradually increases at positions of decreasing vertical distance from the substrate 11. The distance D42 increases from the distance D41 to the distance D43.

In some embodiments, when the height HOF of the patterned layer O11 is equal to the height H132 of the metal layer 132, a connecting point between the upper portion 162 and the lower portion 163 is substantially at a same level above the substrate 11 as the top of the metal layer 132 of the first bit line 13. In some embodiments, when the height HOF is greater than the height H132, the connecting point between the upper portion 162 and the lower portion 163 is higher than (i.e., at a greater vertical distance from the substrate 11 than) the metal layer 132 of the first bit line 13. Similarly, in some embodiments, when the height HOF of the patterned layer O11 is equal to the height H142 of the metal layer 132, the connecting point between the upper portion 162 and the lower portion 163 is substantially at a same level above the substrate 11 as the top of the metal layer 142 of the second bit line 14. In some embodiments, when the height HOF is greater than the height H142, the connecting point between the upper portion 162 and the lower portion 163 is higher than (i.e., at a greater vertical distance from the substrate 11 than) the metal layer 142 of the second bit line 14.

Figure 14:
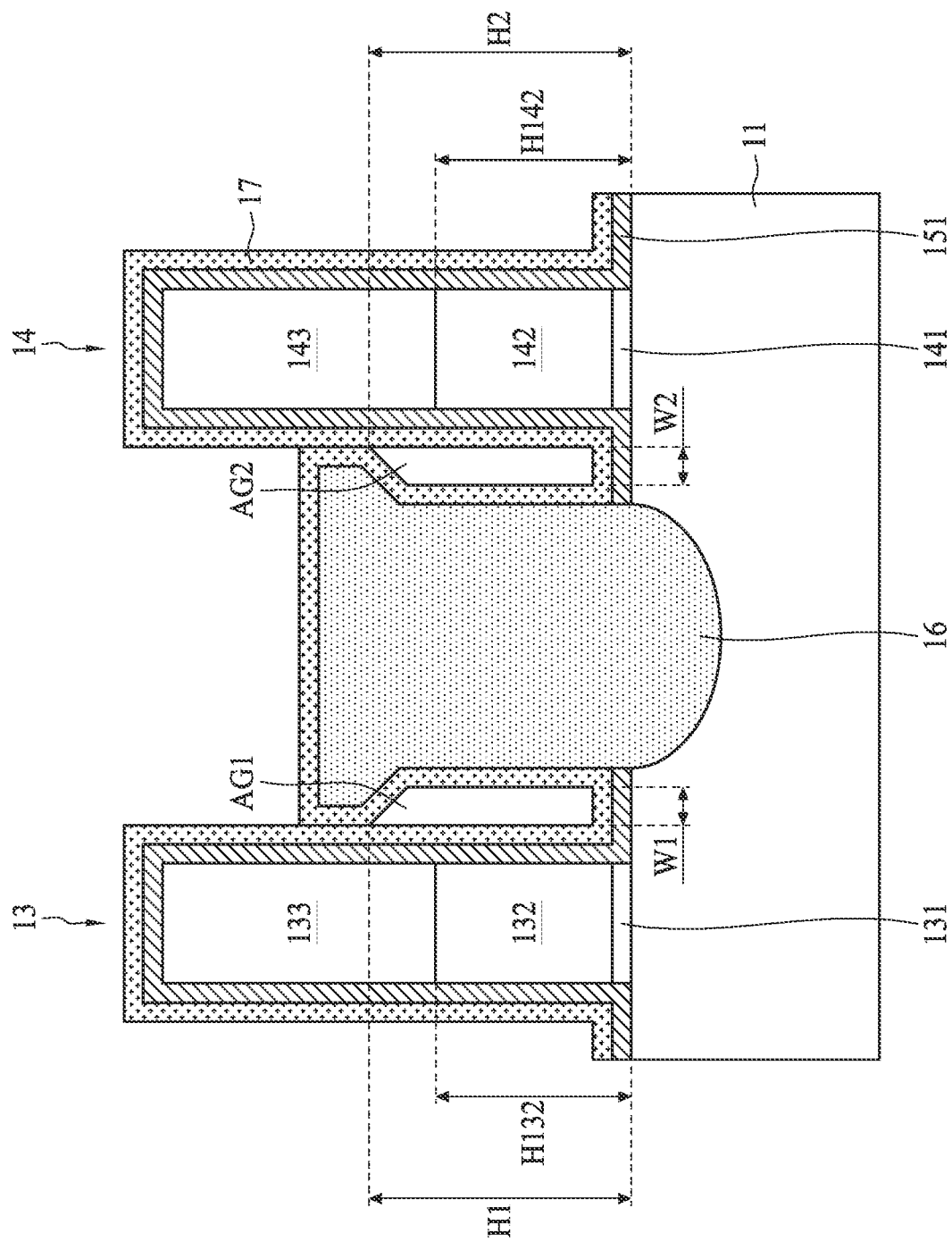

Referring to FIG. 14, in accordance with some embodiments of the present disclosure and the operation S16 of the method M1, the air gap AG1 is formed between the contact 16 and the first bit line 13, and the air gap AG2 is formed between the contact 16 and the second bit line 14. In the operation S16, the dielectric layer 17 is formed conformally over the first bit line 13, the second bit line 14 and the contact 16. In some embodiments, the dielectric layer 17 includes silicon nitride. The dielectric layer 17 seals the space between the upper portion 161 and the first bit line 13, and the space between the upper portion 161 and the second bit line 14. The air gap AG1 and the air gap AG2 are thereby formed between the contact 16 and the first bit line 13, and between the contact 16 and the second bit line 14, respectively. In some embodiments, the dielectric layer 17 fills the space between the upper portion 161 and the first bit line 13, and the air gap AG1 is thereby defined. In some embodiments, the dielectric layer 17 fills the space between the upper portion 161 and the second bit line 14, and the air gap AG2 is thereby defined.

In order to seal the air gap AG1 and the air gap AG2, a thickness of the dielectric layer 17 is designed to be at least half of the thickness of the conformal layer O2. In a preferred embodiment, the thickness of the dielectric layer 17 is substantially half of the thickness of the conformal layer O2. A width W1 of the air gap AG1 and a width W2 of the air gap AG2 are defined by the thickness of the patterned layer O1'. In some embodiments, the width W1 of the air gap AG1 is substantially equal to the thickness of the patterned layer O1'. In some embodiments, the width W2 of the air gap AG2 is substantially equal to the thickness of the patterned layer O1'. In other words, a difference between the distance D31 and the distance D33 is substantially equal to the width W1 of the air gap AG1; and a difference between the distance D41 and the distance D43 is substantially equal to the width W2 of the air gap AG2. A height H1 of the air gap AG1 and a height H2 of the air gap AG2 are defined by the height HOF of the patterned layer O1'. In some embodiments, the height H1 of the air gap AG1 is substantially equal to or greater than the height HOF of the patterned layer O1'. In some embodiments, the height H1 of the air gap AG1 is substantially greater than the height H132 of the metal layer 132 of the first bit line 13. In some embodiments, a difference between the height H1 and the height H132 is substantially greater than or equal to a thickness of the conformal layer O2. In some embodiments, a difference between the height H2 and the height H142 is substantially greater than or equal to the height of the upper portion 162 of the contact 16 (which is a vertical distance between the top portion 161 and the lower portion 163). In some embodiments, the height H2 of the air gap AG2 is substantially equal to or greater than the height HOF of the patterned layer O1'. In some embodiments, the height H2 of the air gap AG2 is substantially greater than the height H142 of the metal layer 142 of the second bit line 14. In some embodiments, a difference between the height H2 and the height H142 is substantially equal to a thickness of the conformal layer O2. In some embodiments, the difference between the height H2 and the height H142 is substantially equal to the height of the upper portion 162 of the contact 16 (which is a vertical distance between the top portion 161 and the lower portion 163). In some embodiments, the portion of the dielectric layer 17 surrounding the upper portion 161 and the portion of the dielectric layer 17 surrounding the first bit line 13 are merged, and there is no boundary between the two portions. Similarly, in some embodiments, the portion of the dielectric layer 17 surrounding the upper portion 161 and the portion of the dielectric layer 17 surrounding the second bit line 14 are merged, and there is no boundary between the two portions.

Figure 15:
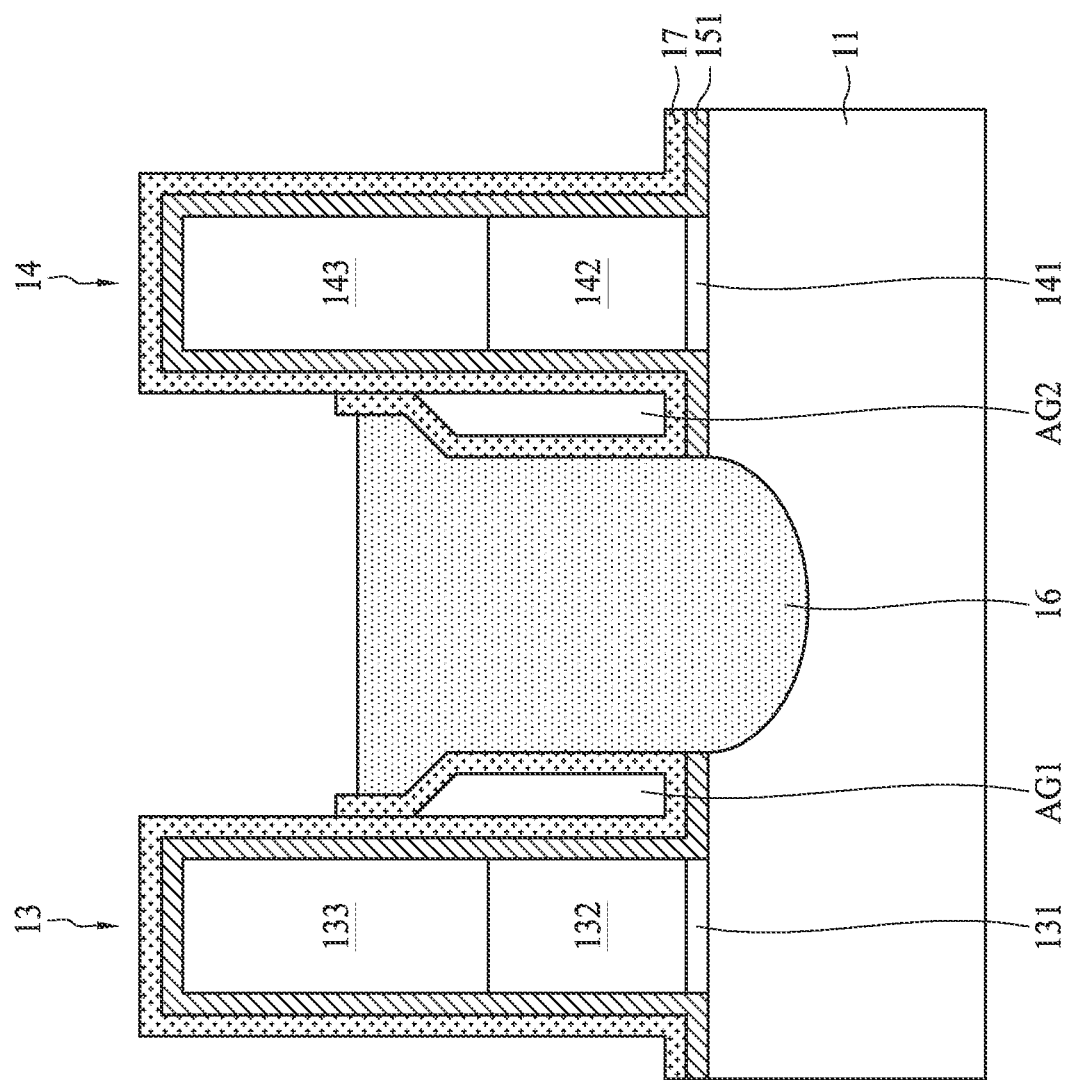

Referring to FIG. 15, in accordance with some embodiments of the present disclosure, the method M1 further includes: exposing the contact 16. In some embodiments, a portion of the dielectric layer 17 over the contact 16 is removed. In some embodiments, prior to the removal, the portion of the dielectric layer 17 is in physical contact with the contact 16. In some embodiments, a dry etching operation is performed to remove the portion of the dielectric layer 17. In some embodiments, a hard mask (not shown) is formed over the first bit line 13 and the second bit line 14 to define the portion of the dielectric layer 17 to be removed. In some embodiments, portions of the dielectric layer 17 on top of the first bit line 13 and on top of the second bit line 14 are also removed during the dry etching operation. In some embodiments, rest portions of the dielectric layer 17 after the dry etching operation has rounded corners (or a spacer profile) due to the property of the dry etching operation.

Figure 16:
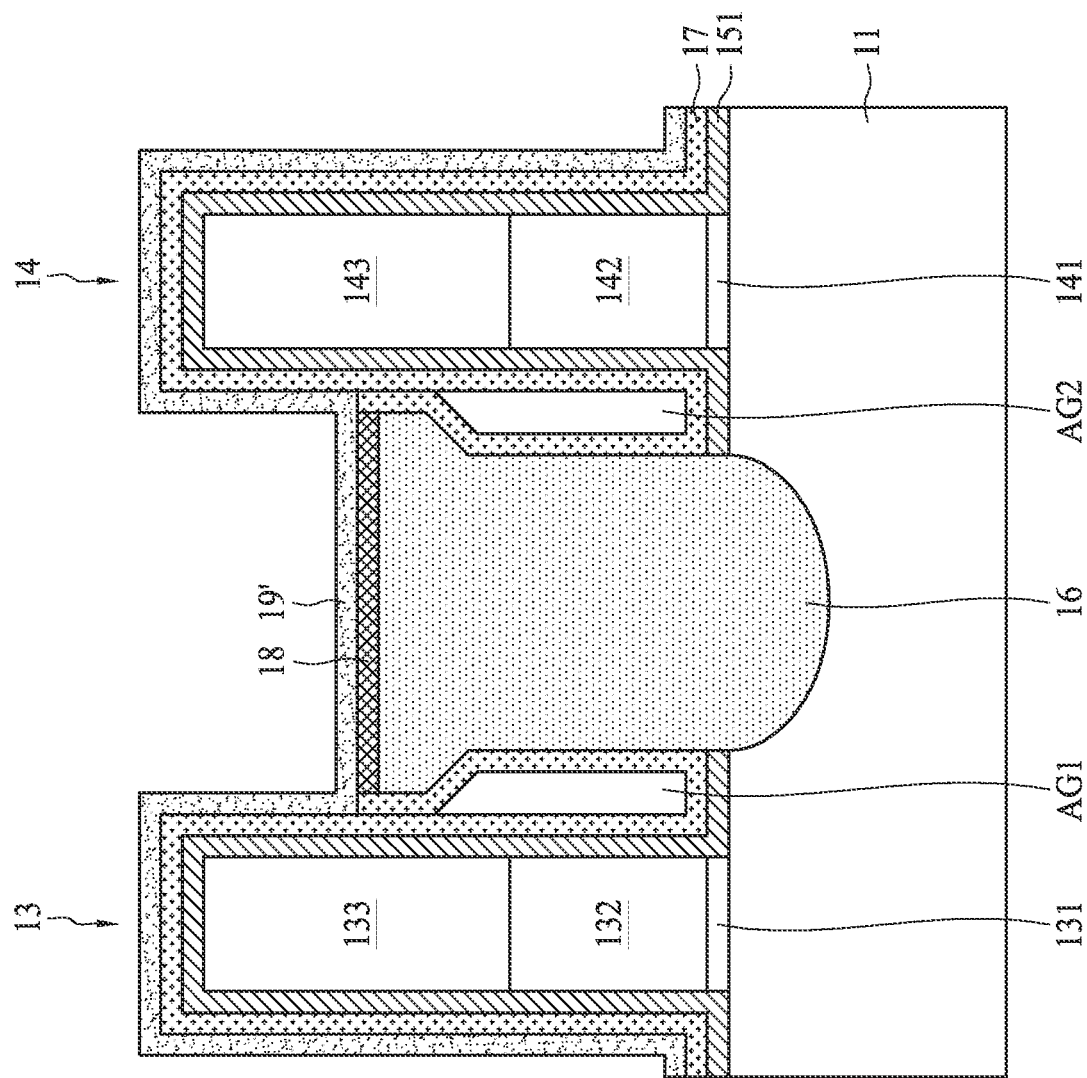

Referring to FIG. 16, in accordance with some embodiments of the present disclosure, the method M1 further includes: forming a contact layer 18 over the contact 16; and forming an adhesion layer 19' over the contact 16, the first bit line 13 and the second bit line 14. In some embodiments, the contact layer 18 include metallic elements. In some embodiments, the contact layer 18 includes cobalt silicon. In some embodiments, the contact layer 18 is formed only on the contact 16. In some embodiments, the contact layer 18 is surrounded by a portion of the dielectric layer 17 extending above the upper portion 161 of the contact 16. In some embodiments, the contact layer 18 can be used to tune electrical resistance of the contact 16. In some embodiments, the adhesion layer 19' serves to provide adhesion between landing pads (to be formed later in the process) and the bit lines (e.g., the first bit line 13 and the second bit line 14). In some embodiments, the adhesion layer 19' includes metal nitride. In some embodiments, the adhesion layer 19' includes at least one of titanium nitride (TiN).

Figure 17:
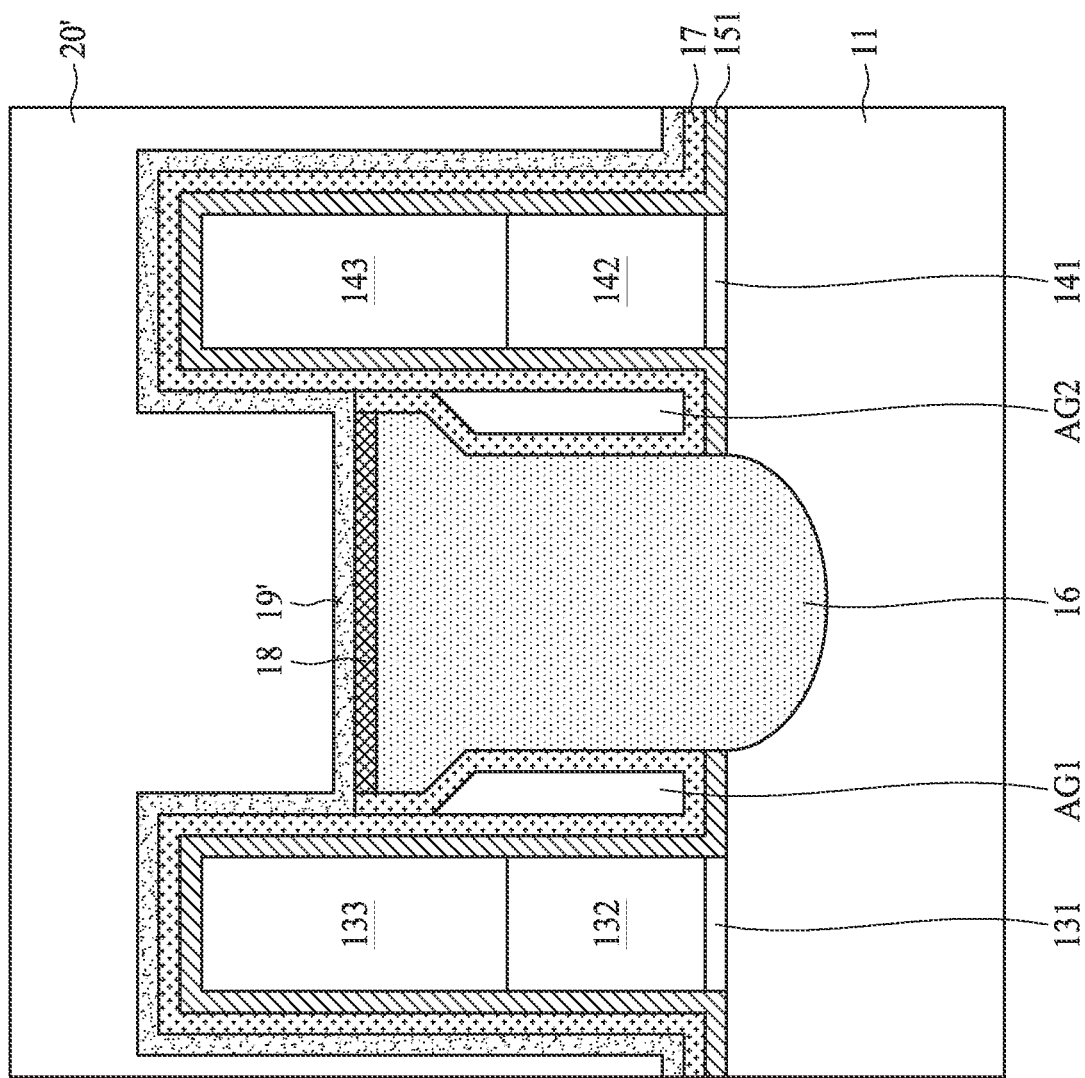
Figure 18:
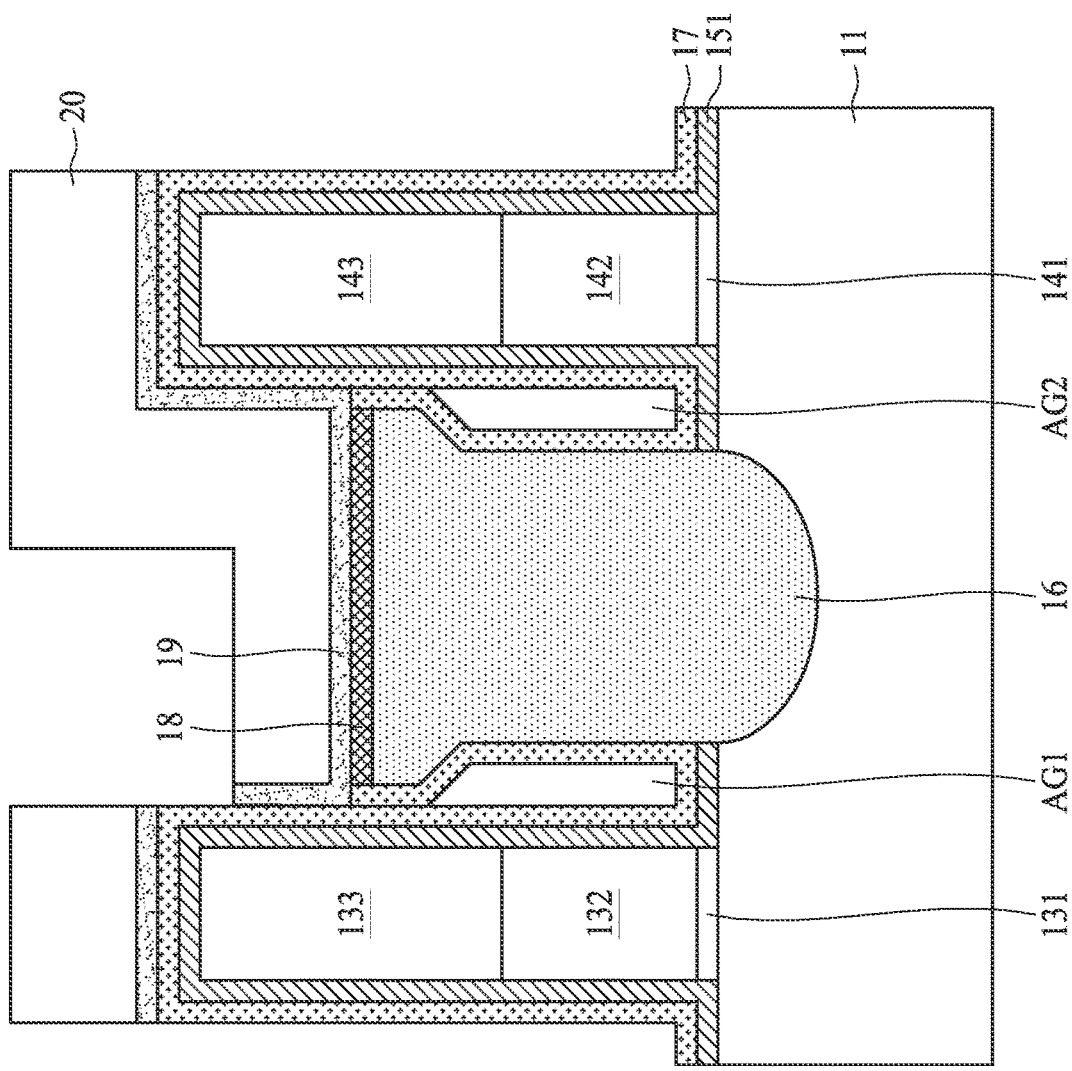

Referring to FIGS. 17 to 18, in accordance with some embodiments of the present disclosure, the method M1 further includes: forming a landing pad 20 over the contact 16. The semiconductor structure 2 is thereby formed as shown in FIG. 18.

In some embodiments, the formation of the landing pad 20 includes: forming a landing layer 20' over the adhesion layer 19'; and removing a portion of the landing layer 20'. In some embodiments, the landing layer 20' is formed by a blanket deposition. In some embodiments, the portion of the landing layer 20' is removed by an etching operation, and one or more landing pads 20 are formed. In some embodiments, a profile of the landing pads 20 is defined by a pattern formed over the landing layer 20'. In some embodiments, a portion of the adhesion layer 19' is removed together with the portion of the landing layer 20' by the same etching operation. In some embodiments, a plurality of adhesion layers 19 are formed concurrently with the plurality of landing pads 20. For ease of illustration, only the adhesion layer 19 and the landing pad 20 disposed on and electrically connected to the contact 16 are described in the following description. In some embodiments, the landing pad 20 is conformal to the contact 16 and an adjacent bit line (e.g., the second bit line 14 of the semiconductor structure 2). In some embodiments, the adhesion layer 19 is disposed conformally between the landing pad 20 and the contact 16, and between the landing pad 20 and the second bit line 14. In some embodiments, the landing pad 20 has rounded corners due to the etching operation, as shown in FIG. 1 of the semiconductor structure 1.

Figure 19:
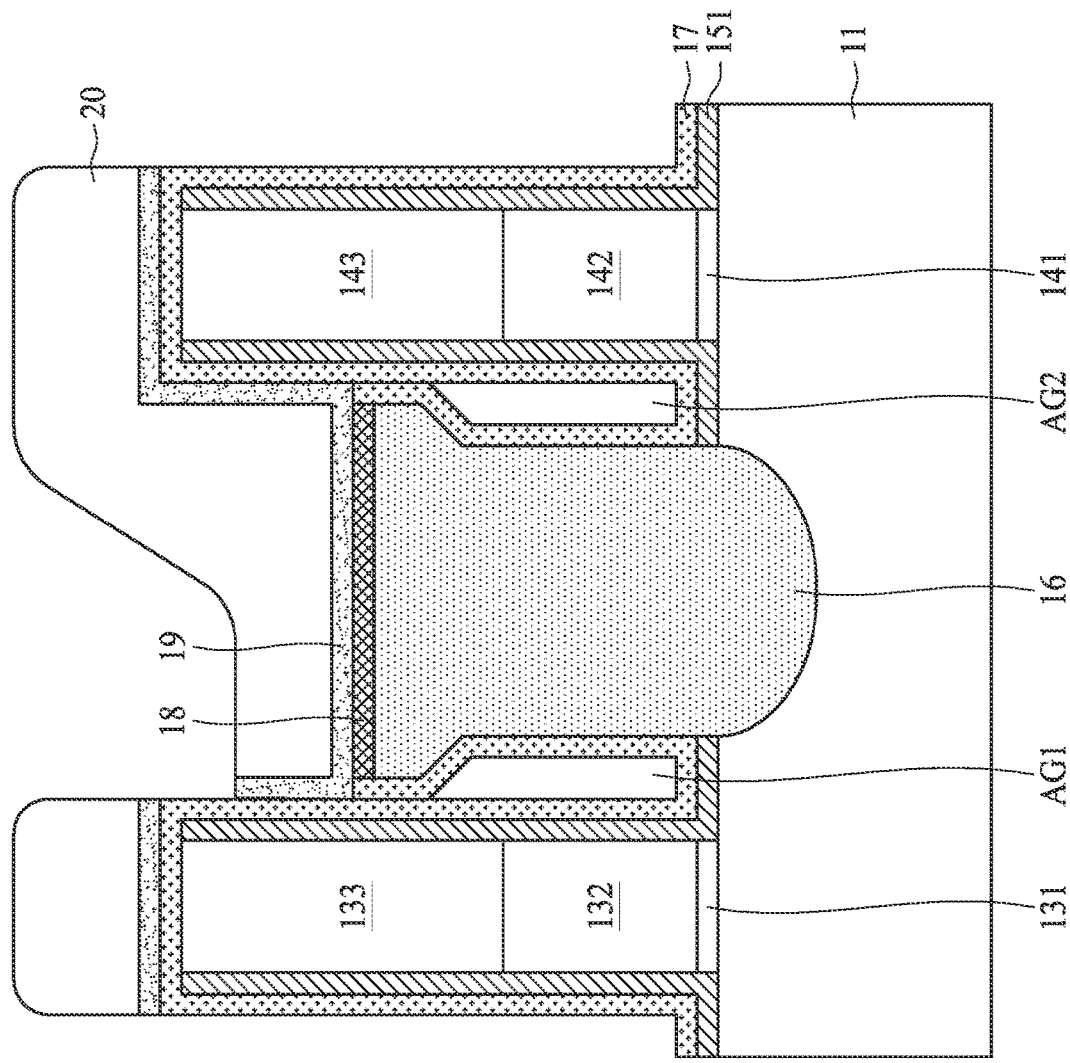
FIG. 19 is a cross-sectional view of a semiconductor structure in accordance with some embodiments of the present disclosure.

FIG. 19 is a schematic cross-sectional view of a semiconductor structure 3 in accordance with some embodiments of the present disclosure. As illustrated above, in some embodiments, the portions of the spacer layer 15 on the top of the first bit line 13 and on the top of the second bit line 14 are consumed during the performance of the method M1. The semiconductor structure 3 is manufactured following the method M1 and has a structure similar to that of the semiconductor structure 1, but the top of the first bit line 13 and the top of the second bit line 14 are exposed through the spacer layer 151.

Figure 20:
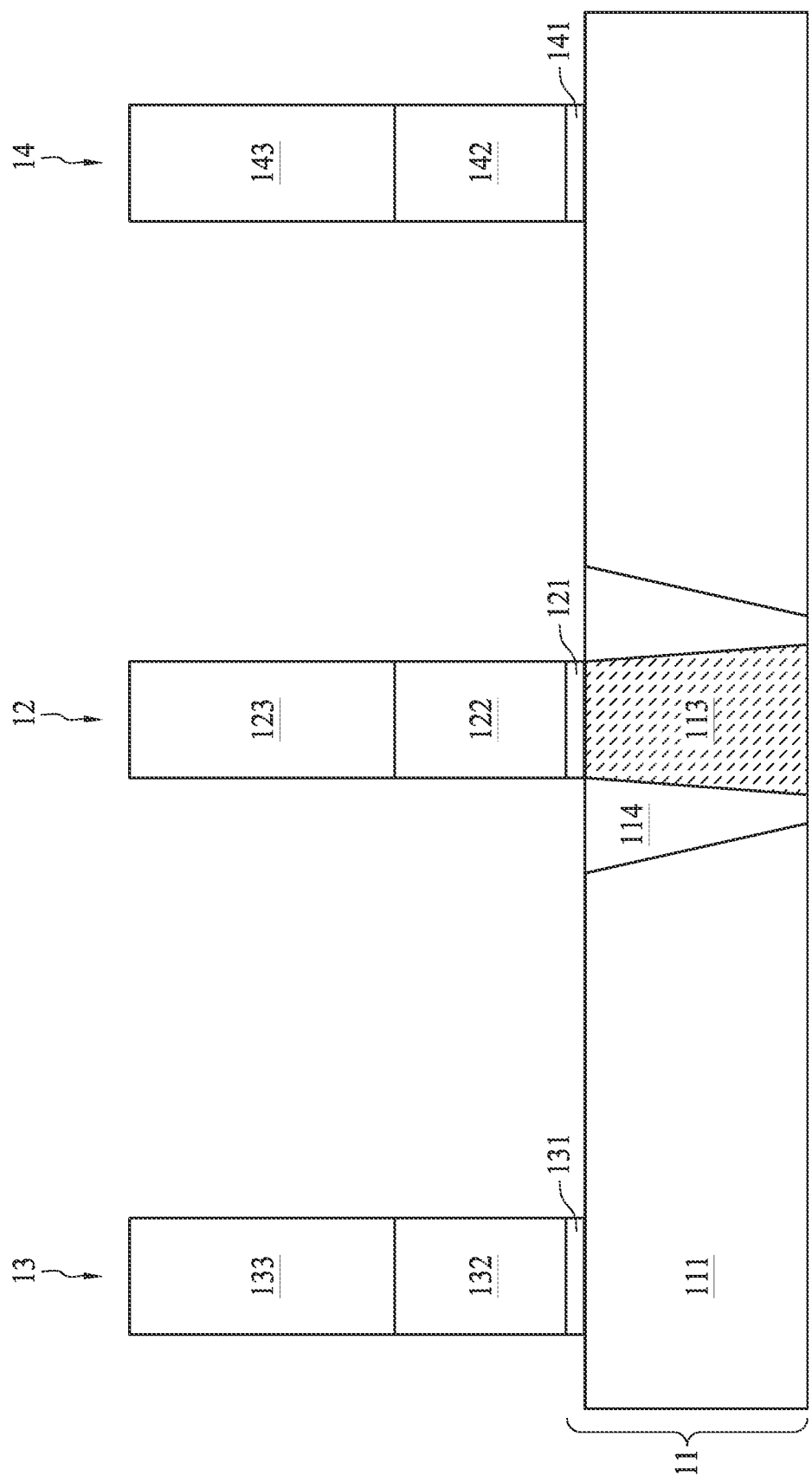
FIGS. 20 to 21 illustrate cross-sectional views of intermediate stages in the formation of a semiconductor structure in accordance with some embodiments of the present disclosure.
Figure 21:
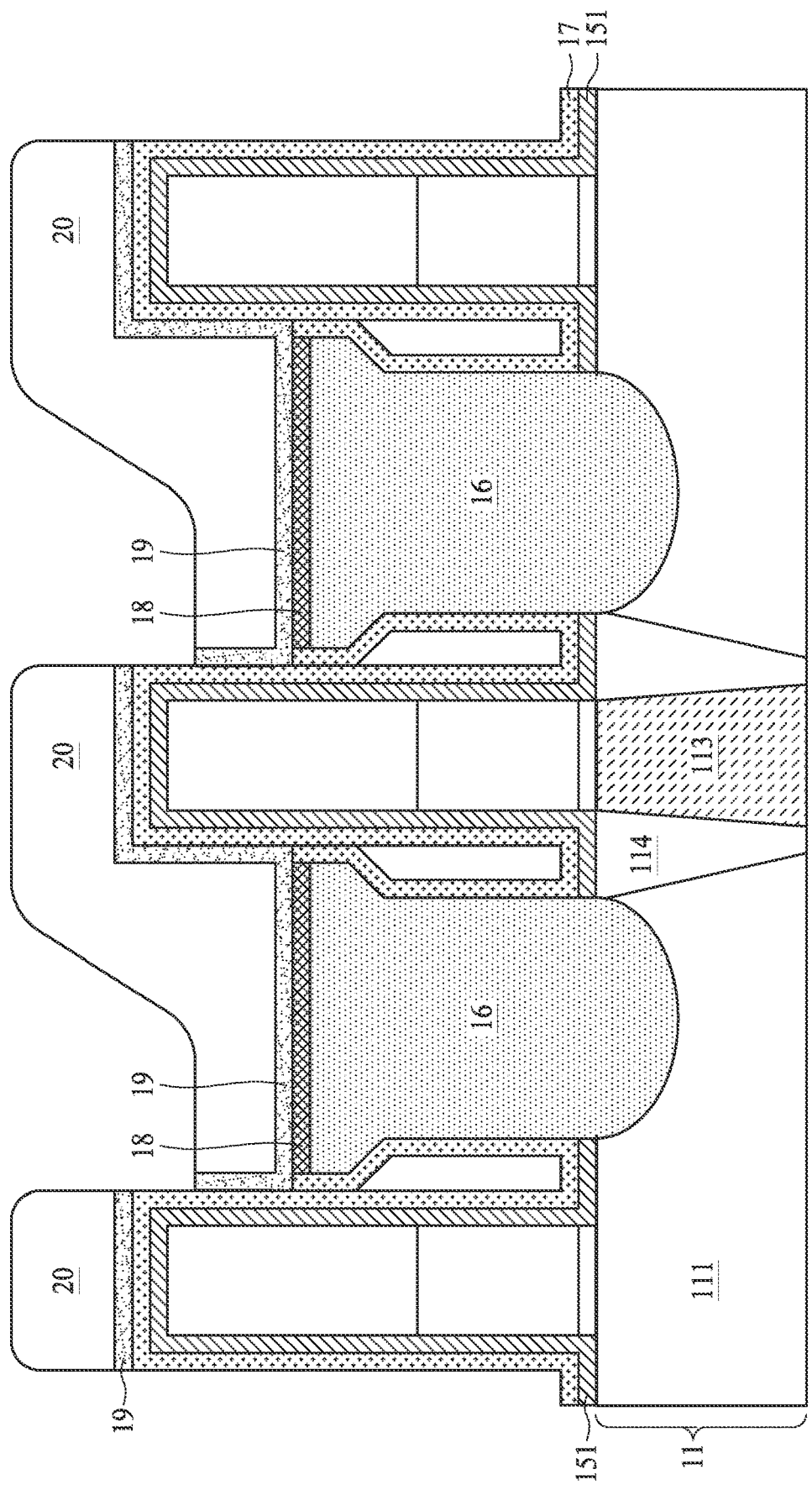

FIGS. 20 to 21 are schematic cross-sectional views of intermediate structures of a semiconductor structure 4 at different manufacturing stages.

As described above, in some embodiments, the substrate 11 includes a plurality of recesses on the top surface of the silicon portion 111. Referring to FIG. 20, in some embodiments, the substrate 11 further includes a bit line contact 113 and an insulating portion 114. In some embodiments, a recess surrounding the bit line contact 113 is formed after the operation S11. In some embodiments, the recess is formed during the step S114 concurrently with the formation of the first bit line 13 and the second bit line 14. In some embodiments, the bit line contact 113 provides electrical connection to a transistor in the substrate 11. In some embodiments, the insulating portion 114 is formed and fills the recess after the operation S11. In some embodiments, the semiconductor structure 4 includes a third bit line 12 between the first bit line 13 and the second bit line 14. In some embodiments, the semiconductor 4 is manufactured according to the method M1, and the third bit line 12 is formed in the operation S11 concurrently with the formation of the first bit line 13 and the second bit line 14. In some embodiments, the third bit line 12 is aligned with the bit line contact 113. The operations S12 to S16 of the method M1 are then performed on the intermediate structure of FIG. 20 to form the semiconductor structure 5 as shown in FIG. 21, and repeated description is omitted herein. In some embodiments, the two contacts 16 are disposed at two edges of two ends of the active region form a top view perspective. In some embodiments, the bit line contact 113 is disposed at a central area or a center of the active region from the top view perspective. It should be noted that the insulating portion 112 may be also included in the substrate 11 of the semiconductor structure 4, but it is not depicted in the FIGS. 20 and 21 for ease of illustration. In some embodiments, the third bit line 12 is in contact with the bit line contact 113 without the insulating portion 112 in-between. In some embodiments, a material of the insulating portion 112 and a material of the insulating portion 114 can by the same.

One aspect of the present disclosure provides a method for manufacturing a semiconductor structure. The method includes: forming a first bit line and a second bit line on a substrate; forming a patterned layer between the first bit line and the second bit line, wherein the patterned layer covers the substrate and surrounds a lower portion of the first bit line and a lower portion of the second bit line; forming a conformal layer on the patterned layer; forming a contact on the conformal layer and between the first bit line and the second bit line, wherein the contact is taller than the patterned layer as measured from the substrate; removing the patterned layer and the conformal layer; and forming an air gap between the contact and the first bit line, or between the contact and the second bit line, wherein the air gap is sealed by a dielectric layer.

Another aspect of the present disclosure provides a method for manufacturing a semiconductor structure. The method includes: forming a bit line on a substrate; forming a first dielectric layer over the substrate and surrounding a lower portion of the bit line; forming a second dielectric layer over the bit line and the first dielectric layer; forming a contact over the second dielectric layer, wherein a height of the contact is greater than a height of the first dielectric layer as measured from the substrate; removing the first dielectric layer and the second dielectric layer; and forming a third dielectric layer conformally over the bit line, the substrate and the contact, thereby forming an air gap between the contact and the bit line.

Another aspect of the present disclosure provides a semiconductor structure. The semiconductor structure includes: a first bit line on a substrate; a contact adjacent to the first bit line on the substrate, wherein a first distance between a top portion of the contact and the first bit line is less than a second distance between a lower portion of the contact and the first bit line; a dielectric layer, disposed conformally over the first bit line, the substrate, and the contact; and a first air gap, sealed by the dielectric layer and defined by the first bit line, the substrate and the contact.

In conclusion, the application discloses a semiconductor structure, and a method for forming the semiconductor structure. The method includes forming two sacrificial layers in order to define an air gap between a contact and a bit line. A nitride-oxide-nitride sandwiched structure is replaced by the two sacrificial layers, and size reduction of the air gap due to nitride refilling in a nitride sealing operation can be avoided. A width and a height of the air gap of the application can be well controlled.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
a first bit line on a substrate;
a contact adjacent to the first bit line on the substrate, wherein a first distance between a top portion of the contact and the first bit line is less than a second distance between a lower portion of the contact and the first bit line;
a dielectric layer, disposed conformally over the first bit line, the substrate, and the contact, wherein the dielectric layer has a first dielectric layer portion formed at a side surface of the first bit line, a second dielectric layer portion formed on a top surface of the substrate, and a third dielectric layer portion formed at a side surface of the contact; and
a first air gap, sealed by the dielectric layer and defined by the first bit line, the substrate and the contact, wherein the first air gap is sealed within the first through third dielectric layer portions of the dielectric layer.

2. The semiconductor structure of claim 1, wherein a vertical distance between a top of the first bit line and the substrate is 90 to 130 nanometers greater than a vertical distance between a top of the contact and the substrate.

3. The semiconductor structure of claim 1, further comprising a spacer layer which has a first portion formed between the side surface of the first bit line and the first dielectric layer portion of the dielectric layer, and a second portion formed between the top surface of the substrate and the second dielectric layer portion of the dielectric layer, wherein the contact above the substrate is tapered toward the substrate.

4. The semiconductor structure of claim 1, wherein the contact is configured in a T-shape to have a bottom portion disposed below the top surface of the substrate, a lower portion extended above the top surface of the substrate, and an upper portion extended from the lower portion, wherein the top portion is extended from the upper portion, wherein the top portion is wider than the lower portion, wherein a width of the upper portion is gradually reduced from the top portion to the lower portion, wherein the first air gap is formed adjacent to the upper portion and the lower portion of the contact.

5. The semiconductor structure of claim 1, wherein a thickness of the dielectric layer is between 3 and 6 nanometers.

6. The semiconductor structure of claim 1, wherein the dielectric layer fills a space between the top portion of the contact and the first bit line to form a top closed end of the first air gap.

7. The semiconductor structure of claim 1, wherein a difference between the first distance and the second distance is substantially equal to a width of the first air gap.

8. The semiconductor structure of claim 1, wherein the first bit line comprises a nitride layer formed on the top surface of the substrate and a metal layer stacked on the nitride layer, wherein a vertical distance between a top of the contact and the substrate is greater than a vertical distance between a top of the metal layer and the substrate.

9. The semiconductor structure of claim 8, wherein the vertical distance between the top of the contact and the substrate is 5 to 45 nanometers greater than the vertical distance between the top of the metal layer and the substrate.

10. The semiconductor structure of claim 1, wherein the first bit line comprises a nitride layer formed on the top surface of the substrate and a metal layer stacked on the nitride layer, wherein a vertical distance between a top of the first air gap and the substrate is greater than or equal to a vertical distance between a top of the metal layer and the substrate.

11. The semiconductor structure of claim 10, wherein a vertical distance between the top of the first air gap and the top of the metal layer is between 0 and 10 nanometers.

12. The semiconductor structure of claim 1, further comprising:
a second bit line on the substrate, wherein the contact is disposed between the first bit line and the second bit line, and the dielectric layer is conformally disposed over the second bit line; and
a second air gap, sealed by the dielectric layer and defined by the second bit line, the substrate and the contact;
wherein the dielectric layer further has a fourth dielectric layer portion formed at a side surface of the second bit line, a fifth dielectric layer portion formed on the top surface of the substrate and positioned apart from the second dielectric layer portion, and a sixth dielectric layer portion formed at an opposed side surface of the contact;
wherein the second air gap is sealed within the fourth through sixth dielectric layer portions of the dielectric layer.

13. The semiconductor structure of claim 12, wherein a vertical distance between a top of the second air gap and the substrate is substantially greater than a vertical distance between a top of a metal layer of the second bit line and the substrate.

14. The semiconductor structure of claim 12, wherein a third distance between the top portion of the contact and the second bit line is substantially less than a fourth distance between the lower portion of the contact and the second bit line.

* * * * *